United States Patent

Tokuda et al.

[11] Patent Number: 5,134,965
[45] Date of Patent: Aug. 4, 1992

[54] PROCESSING APPARATUS AND METHOD FOR PLASMA PROCESSING

[75] Inventors: Mitsuo Tokuda, Tachikawa; Junzou Azuma, Yokohama; Toru Otsubo, Fujisawa; Yasuhiro Yamaguchi, Chigasaki; Ichirou Sasaki, Yokohama, all of Japan

[73] Assignee: Hitachi, Ltd., Tokyo, Japan

[21] Appl. No.: 538,150

[22] Filed: Jun. 14, 1990

[30] Foreign Application Priority Data

Jun. 16, 1989 [JP] Japan .................. 1-152311
Jun. 30, 1989 [JP] Japan .................. 1-167089

[51] Int. Cl.$^5$ .............................................. H01L 21/00
[52] U.S. Cl. ..................... 118/723; 118/715;
118/719; 156/345; 204/298.31; 204/298.33;
204/298.38; 204/298.02; 204/298.07
[58] Field of Search ............ 156/345; 118/723, 719,
118/715; 204/298.31, 298.33, 298.38, 298.02,
298.07

[56] References Cited

U.S. PATENT DOCUMENTS

| | | | |
|---|---|---|---|
| 4,298,419 | 11/1981 | Sunuki et al. | 156/345 |
| 4,776,918 | 10/1988 | Otsubo et al. | 204/298.38 |
| 4,778,561 | 10/1988 | Ghanbari | 156/345 |
| 4,970,435 | 11/1990 | Tanaka et al. | 204/298.38 |
| 4,985,109 | 1/1991 | Otsubo et al. | 156/345 |

FOREIGN PATENT DOCUMENTS

| | | |
|---|---|---|
| 56-96841 | 8/1981 | Japan . |
| 56-13480 | 12/1981 | Japan . |
| 62-298106 | 12/1987 | Japan . |
| 63-103088 | 5/1988 | Japan . |
| 1-283359 | 11/1989 | Japan . |
| 2-138735 | 5/1990 | Japan . |

Primary Examiner—David A. Simmons
Assistant Examiner—George Goudreau
Attorney, Agent, or Firm—Fay, Sharpe, Beall, Fagan, Minnich & McKee

[57] ABSTRACT

Disclosed is a plasma CVD apparatus and a method therefor, the apparatus comprising: a microwave generating portion; a coaxial cavity resonator for making a microwave supplied from the microwave generating portion resonate; a plurality of gas leading inlets provided in under portions of an axis of the cavity resonator and in peripheral wall portions of the cavity resonator for leading-in a supplied CVD gas; and a plasma generating chamber in which the CVD gas lead into the plasma generating chamber through the gas leading inlets and made to flow uniformly onto a surface of a substrate is subject to the microwave made intensive through resonance in the cavity resonator and radiated through a coupling plate so that uniform plasma is generated to thereby form a thin film on the surface of the substrate.

Further disclosed is a plasma processing apparatus and a method therefor, the apparatus comprising; a plasma chamber for maintaining plasma generated in the inside of the plasma chamber so as to perform plasma processing; a first microwave accumulating and intensifying cavity resonance chamber connected with the plasma chamber through a first slot plate; a second microwave accumulating and intensifying cavity resonance chamber connected with the first cavity resonance chamber through a second slot plate parallel to the first slot plate; and a microwave generator for leading a microwave into the second cavity resonance chamber through a waveguide.

21 Claims, 18 Drawing Sheets

PROCESSING APPARATUS AND METHOD FOR PLASMA PROCESSING

BACKGROUND OF THE INVENTION

The present invention relates to a plasma processing apparatus for use for producing semiconductor devices and the like by use of low-temperature plasma and a method therefor. In particular, it relates to a plasma processing apparatus suitable for forming uniform-thick insulating film on a surface of a substrate by a CVD method and for performing processing, such as etching, sputtering, ashing, and so on, and a method therefore.

Conventional CVD apparatuses using low-temperature plasma are classified into two types. One type uses a technique in which plasma is generated by applying a voltage of a high frequency within a range of from 10 KHz to 30 MHz to one of parallel plate electrodes in a vacuum (reference is made to Semiconductor Research 18, p.p. 121–170; Semiconductor Research 19, p.p. 225–267). The other type uses a technique in which plasma is generated by leading a microwave of 2.45 GHz into a vacuum chamber. Of those, the technique using parallel plate electrodes has been used mainly.

On the other hand, a problem that characteristics of devices are influenced by a shock of ions in plasma at the time of formation of thin film has become serious with the advance of the fine structure of semiconductor devices.

Increase of the film-forming rate has been required for improvement of processing capacity.

To increase the film-forming rate, it is necessary to increase the plasma density and the concentration of free radicals (active particles just before ionized). To increase the plasma density and the concentration of free radicals, it is necessary to carry out means for increasing energy to be applied and means for increasing a flow rate of reaction gas.

The reason is in that the film-forming rate is apt to be saturated because the quantity of gas decomposed is limited in the case where the flow rate of reaction gas is increased in the condition that energy is not sufficient. Accordingly, it is necessary to supply sufficient energy for decomposition of reaction gas.

In general, the film-forming rate is increased as applied energy, that is, high-frequency electric power, is increased. However, the parallel plate electrodes have a disadvantage in that energy of ions colliding with the substrate increases as the applied energy increases. There arises a problem in that electrical characteristics of semiconductor devices deteriorate.

Further, there arises a problem in that deterioration of gas decomposing efficiency and incorporation of impurities deposited on walls of a reaction chamber into the surface of the substrate are caused by occurrence of abnormal electric discharge.

On the other hand, in the case where plasma is generated by a microwave, the electric field intensity of the microwave is too low to give energy to electrons for ionization if the microwave generated by a magnetron is directly radiated into a low-pressure plasma generating chamber. There arises a problem in that it is difficult to generate plasma.

Therefore, a method in which energy is given to electrons after a microwave frequency is resonated with a cyclotron frequency in which electrons rotate in plasma perpendicular to the magnetic field and a method in which energy is given to electrons after a microwave is amplified to increase the electric field intensity by radiating the microwave into a cavity resonator have been used conventionally.

The former method is called an electron cyclotron resonance (ECR) method. For example, the method has been proposed in Japanese Patent Unexamined Publication No. 56-13480 (U.S. Pat. No. 4,298,419).

The latter method is disclosed in Japanese Patent Unexamined Publication No. 56-96841 and Japanese Patent Unexamined Publication No. 63-103088 (U.S. Pat. No. 4,776,918) proposed by the inventors of the present application.

In the former method, microwave energy is given directly to electrons so that a voltage of a sheath formed between the plasma ad the substrate little changes. Accordingly, both high plasma density and proper ion energy necessary for high-speed processing can be controlled by applying a high-frequency voltage to the electrode mounting the substrate to thereby control the sheath voltage suitably.

However, the ECR method has the following problem, when a high-frequency voltage is applied to the electrode mounting the substrate as described in the Japanese Patent Unexamined Publication No. 56-13480, a high-frequency current is passed between the electrode and a processing chamber provided in the outside of the substrate because there is no ground electrode in the side opposite to the electrode. Accordingly, the effect of ion energy is strong in the peripheral portion of the substrate but weak in the center portion of the substrate. Consequently, the substrate cannot be processed in the uniform condition. Further, the size of the apparatus becomes large because a coil for generating an ECR magnetic field is required.

To solve such a problem and for the purpose of forming film at a high speed by use of proper ion energy, there has been proposed a plasma processing apparatus using a method of radiating a microwave into a cavity resonator through slits as described in the Japanese Patent Unexamined Publication No. 63-103088.

The proposed plasma processing apparatus will be described hereunder in brief.

In general, in the case where a microwave travels in a waveguide or in a cavity resonator which can be considered to be a kind of waveguide, a current corresponding to electric and magnetic fields flows in a surface of the waveguide. When slits are partially provided in the waveguide so as to cross the current, electric charges are accumulated in opposite ends of each of the slits. The accumulated electric charges change with the traveling of the microwave, so that the electric field between the opposite ends of each of the slits changes to thereby radiate the microwave out of the waveguide.

The plasma processing apparatus is based on the aforementioned theory. As shown in FIG. 1, a microwave generated by a magnetron 3 is led into a cavity resonator 1 through a waveguide 2 and then radiated into a plasma generating chamber 6 through slits 4c formed in the under surface of the cavity resonator 1, so that plasma is generated by use of gas supplied through a gas supply pipe 10. A high-frequency voltage is applied to an electrode 7 on which a substrate 8 is mounted. A slit plate 4 arranged so as to be opposite to the electrode is grounded electrically, so that the slit plate 4 is made to be a counter electrode arranged in parallel with the electrode 7. Consequently, the effect of ions can be given to the whole surface of the substrate 8 uniformly.

The aforementioned prior art technique has a problem in that thin film cannot be formed uniformly because there is no consideration on a flow of gas affecting uniformity in film forming.

In the plasma CVD, thin film is formed by means of chemical reaction in the surface of the substrate. Therefore, the flow of gas in the surface of the substrate has a large influence on the thin-film-forming reaction. Thick film is formed in a portion in which a large quantity of gas flows while thin film is formed in a portion in which a small quantity of gas flows. In short, film having a distribution of film thickness is formed on the substrate. The flow of gas changes according to the pressure and the gas flow rate. For example, in the condition that the pressure and the gas flow rate are not more than 10 mTorr and not more than 100 scm$^3$/sec, respectively, the effect of diffusion can be obtained mainly to make the concentration of gas molecules in the surface of the substrate so uniform that uniform thin film can be formed.

However, there arises a problem in that the film-forming rate is reduced in this condition becomes the gas flow rate is small.

In most cases, this type plasma CVD apparatus has a heater included in a substrate mount. Because the number of gas molecules between the mount and the substrate is small, the heat transmission rate to the substrate is reduced in low pressure. There arises a problem in that a large time is required for heating the substrate. Therefore, film forming under relatively high pressure has been desired.

As described above, however, in the case where film is formed in a high-pressure region, the influence of the viscosity of the gas flow appears. Consequently, the conventional gas supply method has a problem in that thin film cannot be formed on the substrate uniformly.

Further, the conventional ECR method has the following problem. When a high-frequency voltage is applied to the electrode for mounting the substrate thereon as described in the Japanese Patent Unexamined Publication No. 56-13480, a high-frequency current is passed between the electrode and the processing chamber provided in the outside of the substrate because there is no ground electrode in the side opposite to the electrode. Accordingly, the effect of ion energy is strong in the peripheral portion of the substrate but weak in the center portion of the substrate. Consequently, the substrate cannot be processed in the uniform condition.

In the method using a cavity resonator, on the other hand, the wave length of the microwave changes according to the plasma density when plasma is generated, because the plasma is generated in the resonator. There arises a problem in that the condition of resonance is not satisfied so that the plasma is made unstable. In short, because the condition of resonance is satisfied while plasma is not generated, the electric field intensity of the microwave becomes so large that plasma can be generated. However, when plasma density is increased by generation of plasma, the electric field intensity is reduced because the wave length of the microwave changes so that the condition of resonance is not satisfied. When plasma density is reduced, the condition of resonance is satisfied, so that plasma density is increased. The aforementioned phenomenon makes it difficult to generate plasma stably.

If the electrode to which a high-frequency voltage is applied is provided in the cavity resonator in order to control energy of ions entering the substrate through the unstable plasma, reflection of the microwave occurs. There arises a problem in that plasma becomes more unstable.

SUMMARY OF THE INVENTION

An object of the present invention is to provide a plasma processing apparatus in which thin film can be formed speedily and uniformly by CVD, and a method therefor.

Another object of the present invention is to provide a plasma processing apparatus in which stable and high-density plasma can be generated and in which energy of ions entering the substrate can be made uniform over the whole surface of the substrate, and a method therefor.

A further object of the present invention is to provide a plasma processing apparatus in which the distribution of the resonated microwave led from the cavity resonator into the plasma chamber is made uniform to thereby make the plasma processing stable and uniform though a waveguide opening portion for leading the microwave into the cavity resonator is arranged in an eccentric position, and a method therefor.

To attain the foregoing objects, according to an aspect of the present invention, the plasma CVD apparatus comprises: a microwave generating portion; a coaxial cavity resonator for making a microwave supplied from the microwave generating portion resonate; a plurality of gas leading inlets provided in under portions of an axis of the cavity resonator and in peripheral wall portions of said cavity resonator for leading-in a supplied CVD gas; and a plasma generating chamber in which the CVD gas led into the plasma generating chamber through the gas leading inlets and made to flow uniformly onto a surface of a substrate is subject to the microwave made intensive through resonance in the cavity resonator and radiated through a coupling plate so that uniform plasma is generated to thereby form a thin film on the surface of the substrate.

According to another aspect of the present invention, the plasma CVD method comprises the steps of: causing a microwave supplied from a microwave generating portion to resonate by means of a coaxial cavity resonator; supplying a CVD gas through a plurality of gas leading inlets provided in under portions of an axis of the cavity resonator and in peripheral wall portions of the cavity resonator; leading the supplied CVD gas into a plasma generating chamber; and causing the microwave made intensive through resonance in the cavity resonator and radiated through a coupling plate to act on the CVD gas led into the plasma generating chamber through the gas leading inlets and made to flow uniformly onto a surface of a substrate so that uniform plasma is generated to thereby form a thin film on the surface of the substrate.

According to the present invention, gas is led toward the upper surface of the substrate through the gas leading inlets provided in the axis of the coaxial cavity resonator and through the gas leading inlets provided in the peripheral walls of the same. Accordingly, gas can be led to the surface of the substrate uniformly so that uniform thin film can be formed on the substrate.

Further, according to the present invention, in order to generate uniform plasma symmetrical with respect to the axis to thereby form uniform thin film, the resonance mode of the cavity resonator is made to be an H mode, and the slots formed in a surface opposite to the substrate and serving to radiate the microwave into the plasma generating chamber are formed arranged arcuately so as to be symmetrical with respect to the axis of the cavity resonator.

Further, in order to form uniform thin film on a large-scaled substrate, a plurality of cavity resonator units having different sizes are arranged so as to be symmetrical with respect to the axis.

As described above, because the resonance mode of the cavity resonator is made to be an H mode and the slots formed in a surface opposite to the substrate and serving to radiate the microwave into the plasma generating chamber are formed arranged arcuately so as to be symmetrical with respect to the axis of the cavity resonator, the microwave can be radiated uniformly and symmetrically with respect to the axis. Accordingly, plasma can be generated uniformly and symmetrically with respect to the axis, so that uniform thin film can be formed on the substrate.

Further, because the plurality of cavity resonator units having different sizes are arranged so as to be symmetrical with respect to the axis, uniform thin film can be formed on a large-scaled substrate.

To attain the foregoing object, means for controlling the flow rate of gas supplied into the plasma generating chamber through the inside of the axis and the flow rate of gas passing through the inside of the peripheral walls are provided in the present invention.

Further, the gas leading inlets for leading gas into the plasma generating chamber are arranged toward a high-density plasma generating space in order to accelerate the decomposition of gas to make the concentration of free radical molecules on the substrate uniform.

Further, the gas leading inlets for leading gas into the plasma generating chamber are arranged to blow out gas toward the surface of substrate at an angle of 15° or less in order to supply gas to the high-density plasma generating space in the plasma CVD apparatus according to the present invention.

According to the present invention, variable flow rate valves for controlling the flow rate of gas supplied through the inside of the axis and the flow rate of gas supplied through the inside of the peripheral walls may be provided. Because both the flow rate of gas through the inside of the axis of the coaxial cavity resonator and the flow rate of gas through the inside of the peripheral walls can be controlled by those valves, gas can be led onto the surface of the substrate uniformly. Accordingly, uniform thin film can be formed on the substrate.

In other words, according to the present invention, the density of plasma in the plasma generating chamber increases as the distance from the microwave waveguide decreases, while as the distance increases, on the contrary, plasma density decreases. On the other hand, gas led into the plasma generating chamber is led onto the surface of the substrate in plasma and deposited on the surface of the substrate. Dissociation reaction or ionization reaction of gas is progressed in plasma. Plasma CVD reaction is induced by free radical species produced by the dissociation reaction. As the number of free radical species reaching the substrate increases, the thickness of the thus formed film increases. On the contrary, as the number of free radical species decreases, the thickness of the film decreases.

When for example, a method in which gas is passed through low-density plasma and reaches the surface of the substrate is employed as a gas leading method, dissociation reaction is not progressed so that the film-forming rate becomes low. When, for example, a method in which gas is passed through the high-density region of plasma is employed, dissociation reaction is progressed to increase the number of free radical species so that the film-forming rate becomes high. Accordingly, if gas passed through high-density plasma and gas passed through low-density plasma coexist in the gas reaching the surface of the substrate, the distribution of film thickness becomes ununiform.

According to the present invention, the gas leading inlets for leading gas into the plasma generating chamber are arranged toward the high-density plasma generating space. Accordingly, dissociation reaction is accelerated so that the lead gas reaches the surface of the substrate rapidly. Accordingly, film can be formed speedily and uniformly.

Further, in the plasma CVD apparatus according to the present invention, high-density plasma is generated in the vicinity of the arrangement of the slots. Accordingly, the gas leading inlets for leading gas into the plasma generating chamber are arranged to blow out gas at an angle of 15° or less with respect to the surface of the substrate to thereby accelerate the dissociation reaction.

To attain the foregoing objects, according to a further aspect of the present invention, the plasma processing apparatus comprises: a plasma chamber for maintaining plasma generated in the inside of the plasma chamber so as to perform plasma processing; a first microwave accumulating and intensifying cavity resonance chamber connected with the plasma chamber through a first slot plate; a second microwave accumulating and intensifying cavity resonance chamber connected with the first cavity resonance chamber through a second slot plate parallel to the first slot plate; and a microwave generator for leading a microwave into the second cavity resonance chamber through a waveguide.

According to the present invention, in the aforementioned plasma processing apparatus, the cavity resonator is provided with impedance distribution control means for controlling impedance against inside electricity or magnetism in the cavity resonator without giving any influence on a natural resonance mode of the cavity resonator.

Further, the impedance distribution control means may be formed by use of an impedance difference between positions for materials of the inner walls of the cavity resonator or for surface processing.

Further, the impedance distribution control means may be formed by adjusting the form of the slots in the microwave radiation slot plate.

Further, the impedance distribution control means may be formed by adjusting the shape of the slots in the second slot plate electromagnetically connecting two or more cavity resonators.

In general, in the case where a microwave travels in a waveguide or in a cavity resonator considered to be a kind of waveguide, a current corresponding to electric and magnetic fields flows in a surface of the waveguide. Accordingly, when slots are partially provided in the waveguide so as to cross the current, electric charges are accumulated in opposite ends of each of the slots. The accumulated electric charges change with the traveling of the microwave, so that the electric field between the opposite ends of each of the slots changes to thereby radiate the microwave out of the waveguide.

The waveguide for guiding the microwave generated by the microwave generator into the cavity resonator is generally provided at an eccentric position with respect to the cavity resonator. Accordingly, if the microwave led into the second cavity resonator chamber is passed through the second slot plate, the distribution of energy of the microwave cannot be said to be uniform. Therefore, if the microwave passed through the second slot plate is led into the first cavity resonator chamber and then led into the plasma chamber through the first slot plate, the distribution of energy of the microwave is made more uniform. Not only plasma generated in the plasma chamber by the microwave having the uniform distribution of energy is stable but energy of ions entering the substrate as a subject is made uniform over the whole surface of the substrate. In short, the waveguide opening portion for leading the microwave into the cavity resonator is arranged at an eccentric position with respect to the center of the cavity resonator. As a result, impedance against electromagnetic fields in the waveguide opening portion becomes relatively high compared with that in the peripheral portions, so that the distribution of the surface current flowing in the inside of the cavity resonator becomes ununiform. Therefore, the impedance in the inside of the cavity resonator is corrected by exchanging materials and surface processing methods, adjusting the form of the slots in the microwave radiation slot plate or adjusting the form of the slot plate provided between the cavity resonator chambers. By the correction, the distribution of the surface current in the cavity resonator can be made uniform. Accordingly, the distribution of the microwave radiated to the outside and the distribution of plasma can be made uniform. Consequently, the plasma processing can be made uniform.

DESCRIPTION OF THE PREFERRED EMBODIMENTS

A plasma CVD apparatus as an embodiment of the present invention will be described hereunder with reference to FIGS. 2A and 2B.

Figure 2A:
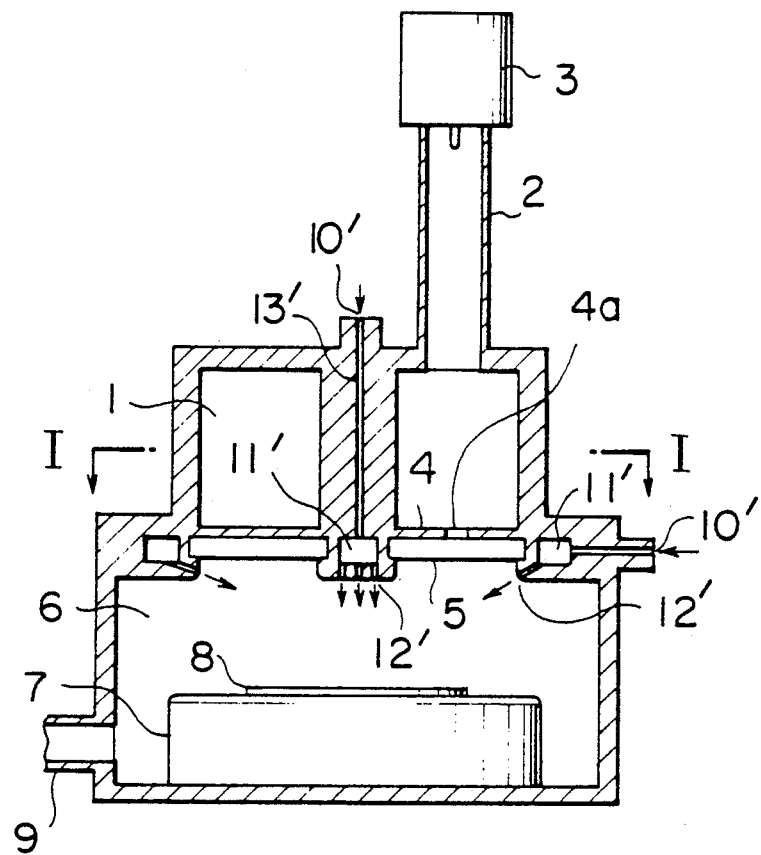
FIG. 2A is a sectional front view of a plasma CVD apparatus as a first embodiment of the present invention.

As shown in FIG. 2A, a cavity resonator 1 is constituted by a so-called coaxial circular resonator having an axial portion 1a in the center of its round shape. A magnetron 3 is provided on the cavity resonator 1 through a waveguide 2 which is mounted on the upper surface of the cavity resonator 1 eccentrically so as to improve the degree of coupling. Though not shown, devices, such as a microwave power monitor, a matching unit, an isolator, and the like, may be mounted on the waveguide 2.

Figure 2B:
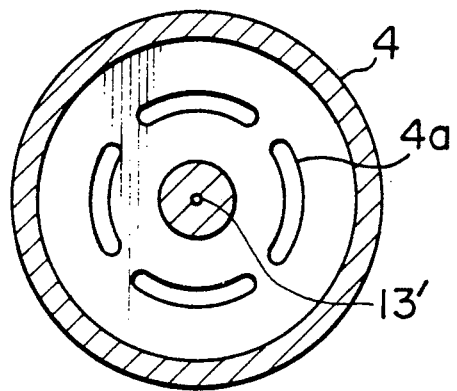
FIG. 2B is a sectional plan view taken along the line I—I in FIG. 2A.

As shown in FIG. 2B, a slot plate 4 having a plurality of arcuate slots 4a (four slots, in the drawing) circumferentially arranged is provided on the under surface of the cavity resonator 1. In this embodiment, the size of the coaxial resonator 1 is determined to make the mode of the coaxial resonator 1 be an $H_{01}$ mode. Accordingly, the slots 4a are shaped in accordance with a resonant mode based on the theory of a slot antenna. In other words, the slots 4a are shaped like arcs extending along the circumference of the slot plate. A vacuum-sealing quartz plate 5 is fixed under the slots 4a, so that a microwave from the cavity resonator 1 is radiated, through the slots 4a and the quartz plate 5, into a plasma generating chamber 6 provided under the quartz plate 5. A substrate mount 7 for mounting a substrate 8 thereon is provided on the inside bottom portion of the plasma generating chamber 6. A heater (not shown) for heating the substrate 8 is provided within the substrate mount 7. The plasma generating chamber 6 is provided with a gas exhaust pipe 9 connected to a vacuum pump (not shown) to control the pressure of the plasma generating chamber 6 to be within a range of 1 to $10^{-3}$ Torr.

In the axial portion 1a, there are provided a gas flow path 13' connected to a gas source (not shown) through a gas supply pipe 10', a buffer 11' connected to the gas flow path 13', and gas leading inlets 12' arranged so as to be opened toward the center portion of the substrate 8 in the plasma generating chamber 6.

Further, a ring-like buffer 11' is provided in the peripheral wall of the cavity resonator 1. The buffer 11' is connected to the gas source through the gas flow path 13' and the gas supply pipe 10' and connected to other gas leading inlets 12' arranged so as to be opened toward the peripheral portion of the substrate 8. For example, the axial portion 1a is formed of aluminum to thereby prevent the microwave generated in the cavity resonator from entering the gas flow path 13'.

In the following, the operation of the apparatus is described.

The microwave generated by operating the magnetron is supplied into the cavity resonator 1 through the waveguide 2. The energy of the microwave amplified in the cavity resonator 1 is radiated through the slots 4a and the quartz plate 5 so as to enter the plasma generating chamber 6 provided under the quartz plate 5.

On the other hand, gas is supplied toward the center portion of the substrate 8 through the gas leading inlets 12' provided in the axial portion 1a, and, at the same time, gas is supplied toward the center and peripheral portions of the substrate 8 through the gas leading inlets 12' provided in the peripheral wall of the cavity resonator 1. A predetermined flow rate of the gas is supplied through the gas leading inlets 12', 12' so that the flow of the gas on the substrate can be made uniform.

Figure 3:
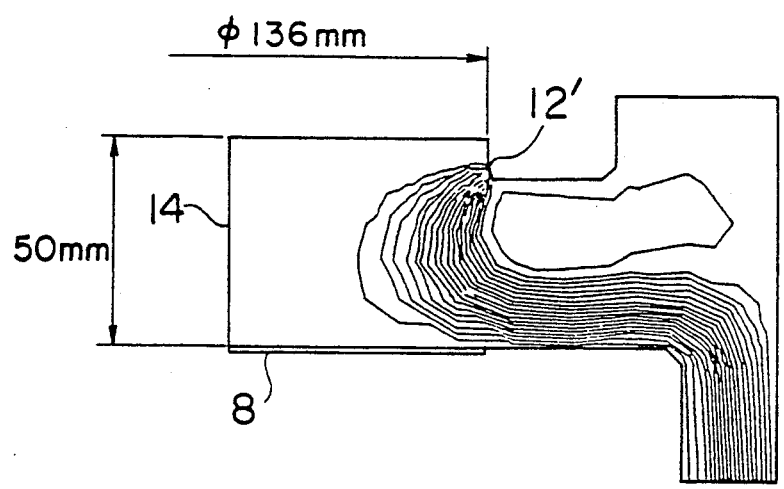
FIG. 3 is a simulation view of a flow of gas spouted out only from a gas leading inlet formed in peripheral portions of a cavity resonator depicted in FIGS. 2A and 8.
Figure 4:
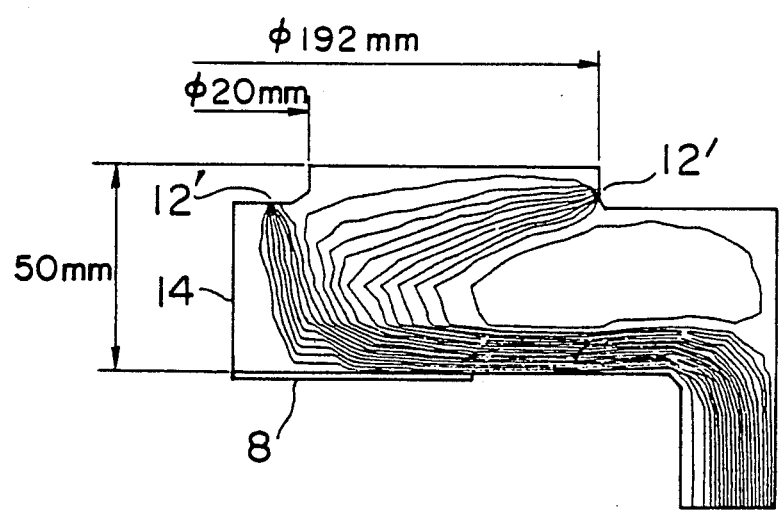
FIG. 4 is a simulation view of a flow of gas spouted out from gas leading inlets formed respectively in the central portion and in the peripheral portion of the cavity resonator depicted in FIG. 2A.

The results of simulation of the gas flow are shown in FIGS. 3 and 4. In each of FIGS. 3 and 4, the gas flow is expressed in the form of flow lines obtained by solving simultaneous equations constituted by the Navier-Stokes' equation and the equation of continuation. FIG. 3 shows an example in the case where the gas is blown out only through the gas leading inlets 12' provided in the peripheral wall of the cavity resonator 1. In FIG. 3, the distance between the quartz plate 5 and the substrate 8 is established to be 50 mm; and the diameter of the ring-like arrangement of the gas leading inlets 12' is established to be 136 mm. FIG. 4 shows flow lines in the case where the coaxial resonator as shown in FIGS. 2A and 2B is used. In FIG. 4, the flow lines are calculated under the condition that the diameter of the circular arrangement of the gas leading inlets 12' provided in the center portion of the cavity resonator and the diameter of the ring-like arrangement of the gas leading inlet 12' provided in the peripheral portion of the same are established to be 20 mm and 192 mm, respectively. Although a large part of the gas in FIG. 3 flows in the peripheral portion of the substrate 8, the flow of the gas in FIG. 4 is made uniform. It is apparent that thin film formed on the substrate 8 can be made uniform in the case of FIG. 4.

Figure 8:
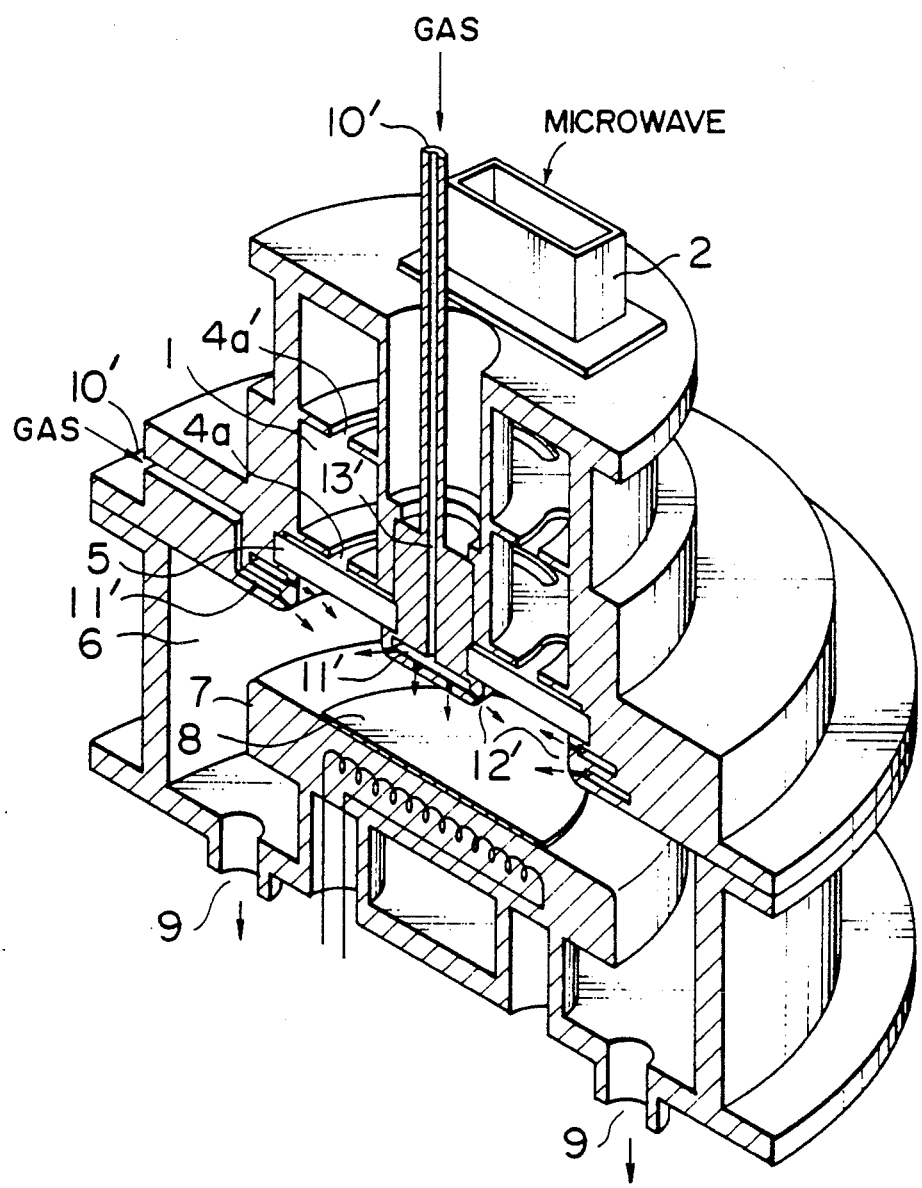
FIG. 8 is a sectional perspective view of a plasma CVD apparatus as a fifth embodiment of the present invention.

The same result of simulation of the gas flow is obtained in another embodiment shown in FIG. 8.

A plasma CVD apparatus as another embodiment of the present invention will be described hereunder with reference to FIG. 5.

Figure 5:
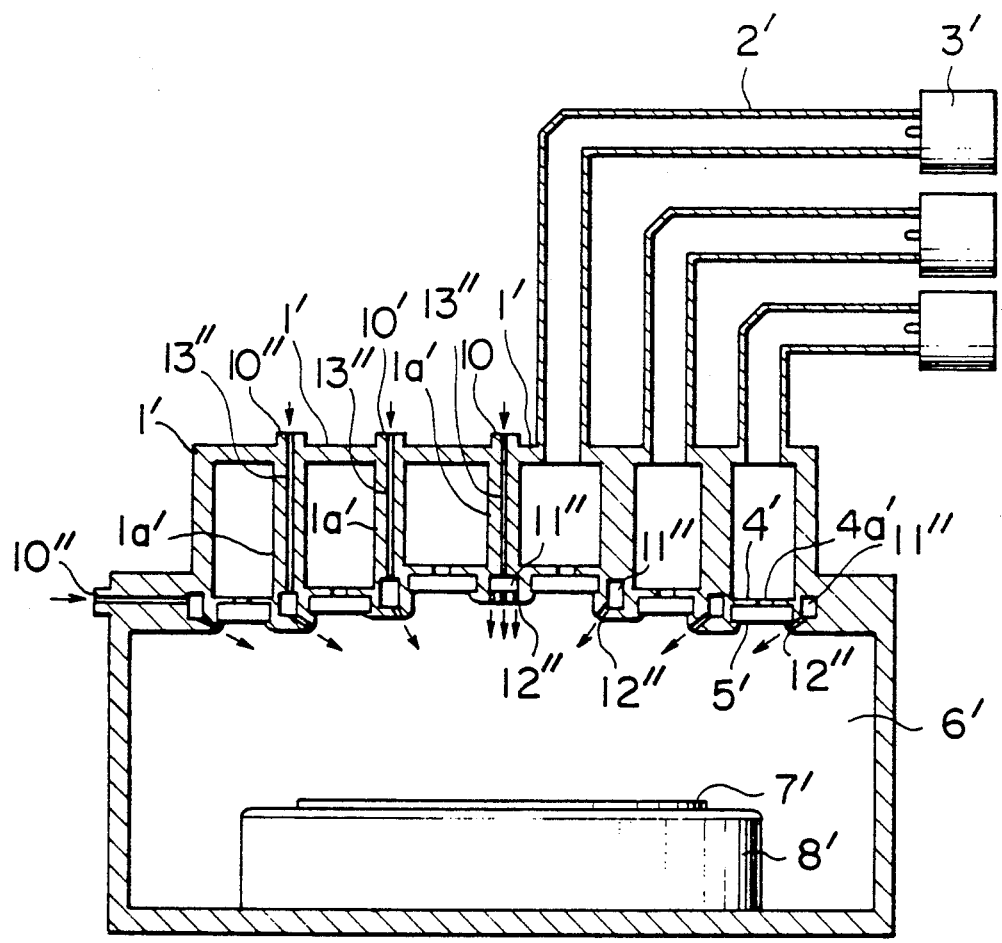
FIG. 5 is a sectional view of a plasma CVD apparatus as a second embodiment of the present invention.

FIG. 5 shows the case where three coaxial resonators 1', 1', 1' having different diameters are united into one body. In FIG. 5, gas flow paths 13", 13", 13", buffers 11", 11", 11" and gas leading inlets 12", 12", 12" are respectively provided in conductor portions 1a', 1a', 1a' at boundaries between the coaxial resonators 1', 1', 1'.

Further, gas flow paths 13", buffers 11' and gas leading inlets 12" are provided also in the peripheral portions.

Accordingly, uniform thin film on the substrate 8 can be formed by blowing out gas through the gas leading inlets 12", 12", 12" provided so as to be located on a plurality of pitch circles in the center portion and its peripheral portions.

A plasma CVD apparatus as a further embodiment of the present invention will be described hereunder with reference to FIG. 6.

Figure 6:
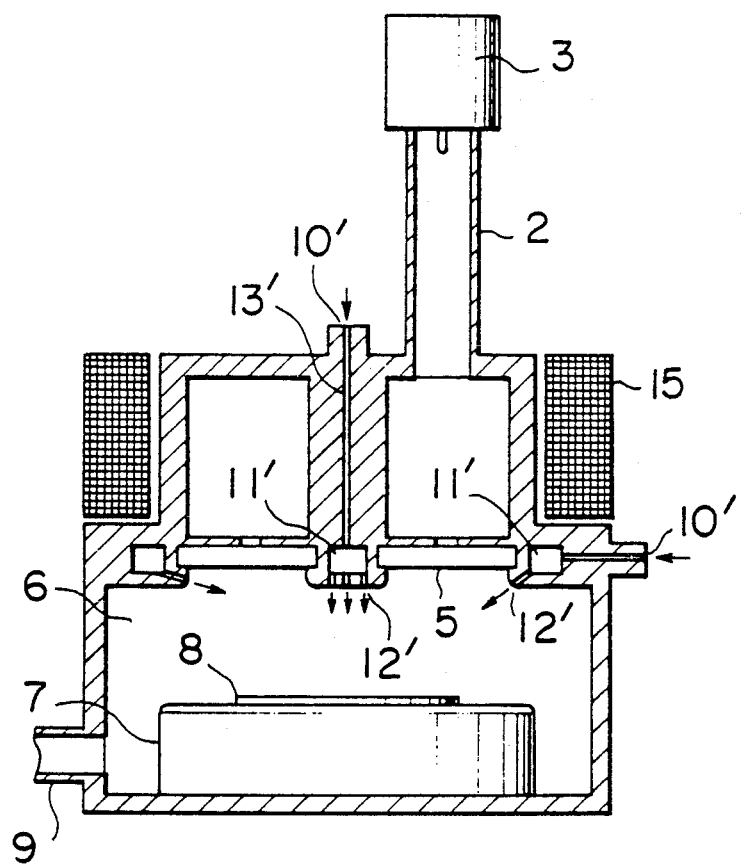
FIG. 6 is a sectional view of a plasma CVD apparatus as a third embodiment of the present invention.

FIG. 6 shows the case where a coil 15 for generating a magnetic field is used in combination with the plasma CVD apparatus as shown in FIG. 2.

In the case where the pressure of the plasma generating chamber 6 in the embodiment shown in FIG. 2 is high, the mean free path of gas molecules is so small that electrons can collide with the gas molecules with each other frequently enough to attain high plasma density.

On the contrary, in the case where the pressure of the plasma generating chamber 6 in the embodiment shown in FIG. 2 is low, the mean free path of gas molecules is so large that electrons reaching walls of the plasma generating chamber 6 and disappearing at the walls without collision with the gas molecules increase in number. As a result, the frequency of collision with the gas molecules becomes so lowered that plasma can be hardly generated.

As described above, in this embodiment, a magnetic field generating coil 15 is provided in the peripheral portion of the cavity resonator 1. In this embodiment, the magnetic field generating coil 15 generates a magnetic field in a direction parallel to the direction of radiation of the microwave to make electrons move round magnetic lines of force, so that disappearance of electrons at the walls can be prevented.

Accordingly, the probability that electrons collide with the gas molecules increases. There arises an effect in that ignitable plasma can be obtained.

A plasma CVD apparatus as a further embodiment of the present invention will be described with reference to FIGS. 7A and 7B.

Figure 7A:
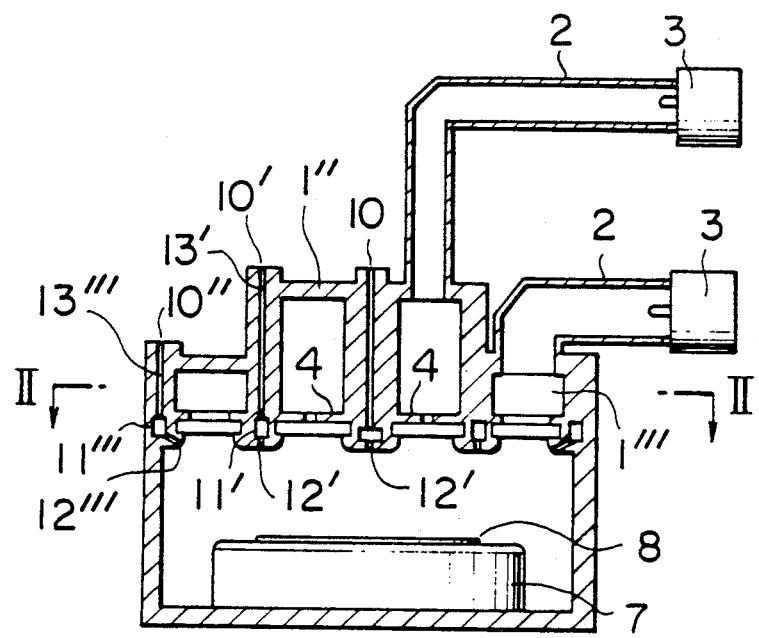
FIG. 7A is a sectional front view of a plasma CVD apparatus as a fourth embodiment of the present invention.
Figure 7B:
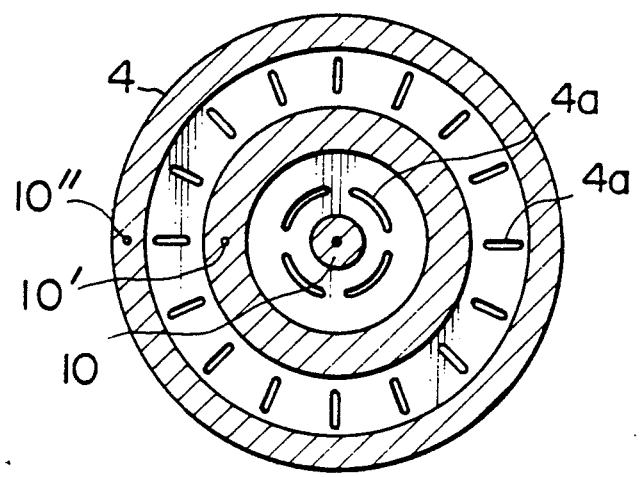
FIG. 7B is a sectional plan view taken along the line II—II in FIG. 7A.

As shown in FIG. 7A, a resonator 1''' having an $H_{10}$ mode corresponding to the vibration mode of the waveguide 2 is provided in a peripheral portion of a center coaxial resonator 1''. In this embodiment, a gas flow path 13′′′ connected to a gas source (not shown) through a gas supply pipe 10′′′, a buffer, 11′′′ connected to the gas flow path 13′′′, and gas leading inlet 12′′′ connected to the buffer 11′′′ so as to be opened toward the inside of the plasma generating chamber 6 are provided so as to be located on the center axial portion 1a′′ of the center axial resonator 1′′ and on a plurality of pitch circles in the peripheral portions thereof.

Accordingly, also in this embodiment, uniform thin film can be formed on the substrate 8.

A further embodiment of the present invention will be described with reference to FIG. 8. The cavity resonator 1 is a so-called coaxial circular resonator having an integrally formed axial portion 1a in the center of its circular shape. A waveguide 2 is eccentrically attached onto the cavity resonator 1 at its upper surface to improve the degree of coupling between the waveguide 2 and the cavity resonator 1 with respect to microwave supply. Further, a slot plate 4′ having slots 4a′ is provided in the intermediate portion of the cavity resonator 1. Two slot plates 4 and 4′ are arranged in parallel to each other. The length t to the cavity resonator 1 separated by the intermediate slot plate 4′ is established to be an integral multiple of the half of the guide wavelength or a value near the integral multiple.

The energy of the microwave radiated from the slots 4a′ changes according to the distribution of electric field intensity formed by a standing wave within the cavity resonator, so that the standing wave must be uniform within the cavity resonator. However, the standing wave formed in the upper cavity resonator chamber 1 hardly has a uniform distribution, because of existence of an opening for coupling with the waveguide 2. Therefore, the lower cavity resonator chamber 1 and the lower slot plate 4 are provided to make the distribution of the standing wave in the lower cavity resonator chamber 1 relatively uniform compared with that in the upper cavity resonator chamber 1. As a result, the uniformity of the distribution of the microwave energy radiated into the plasma generating chamber through the slots 4a is more improved.

Because the microwave generated in the magnetron 3 is amplified through the cavity resonator 1 constituted by the two cavity resonator chambers, the gas in the plasma chamber 6 is so excited to form ion gas or free radical gas so that plasma is ignited and maintained by supply of the microwave energy even though the plasma chamber 6 has not a structure of a cavity resonator.

Figure 1:
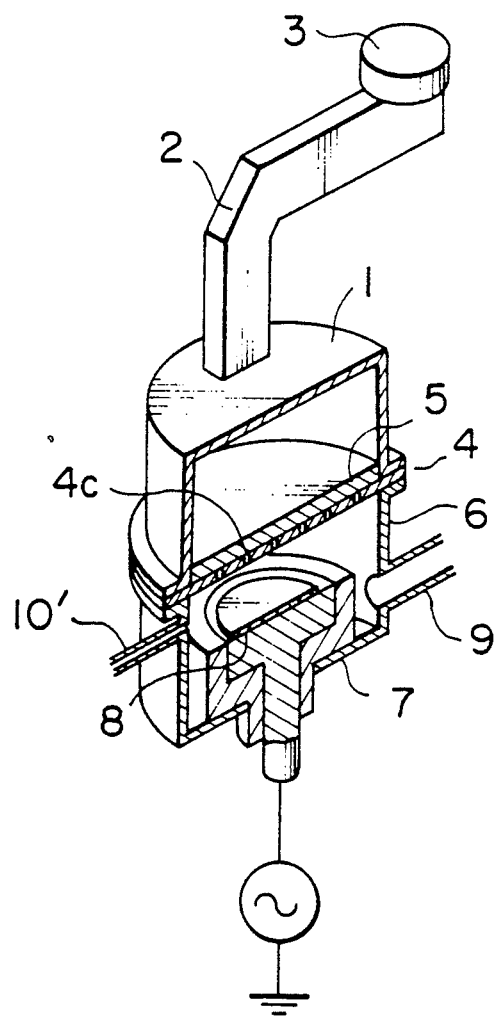
FIG. 1 is a sectional perspective view of a conventional plasma processing apparatus.
Figure 9:
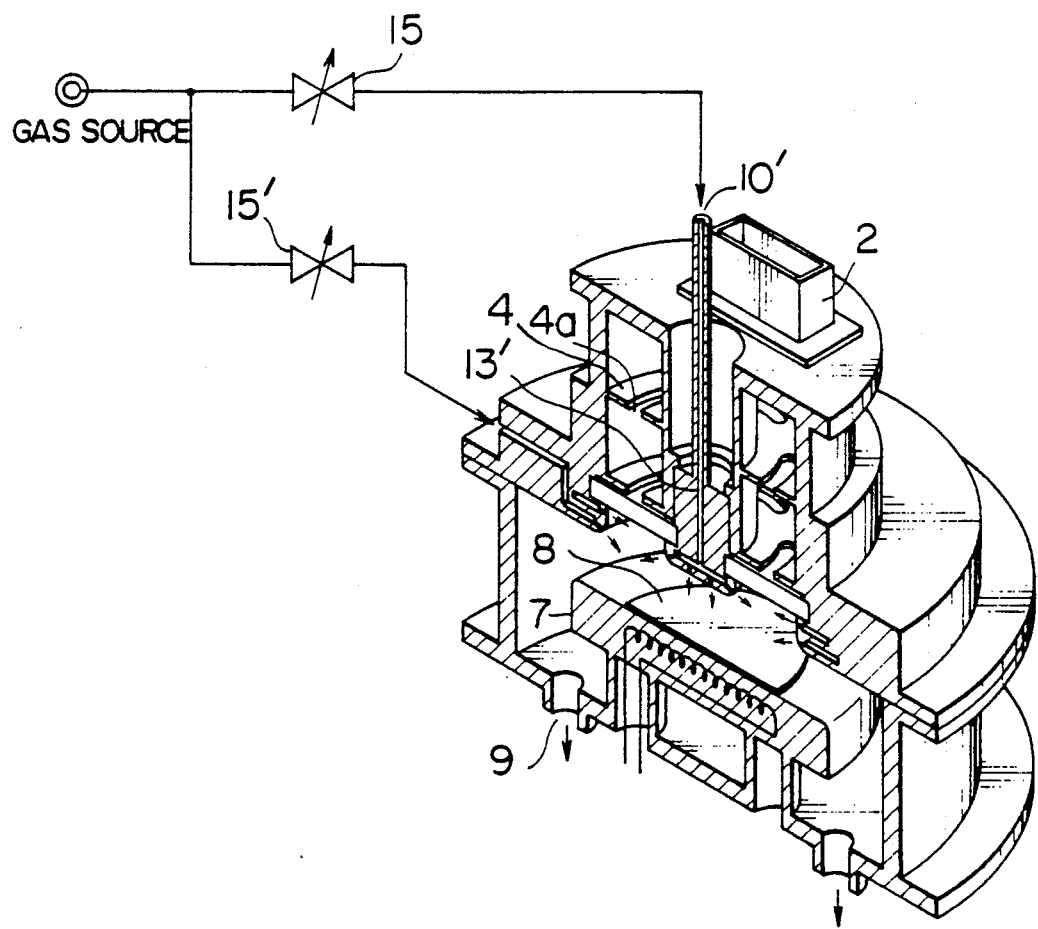
FIG. 9 is a sectional perspective view showing a sixth embodiment of the present invention.
Figure 10:
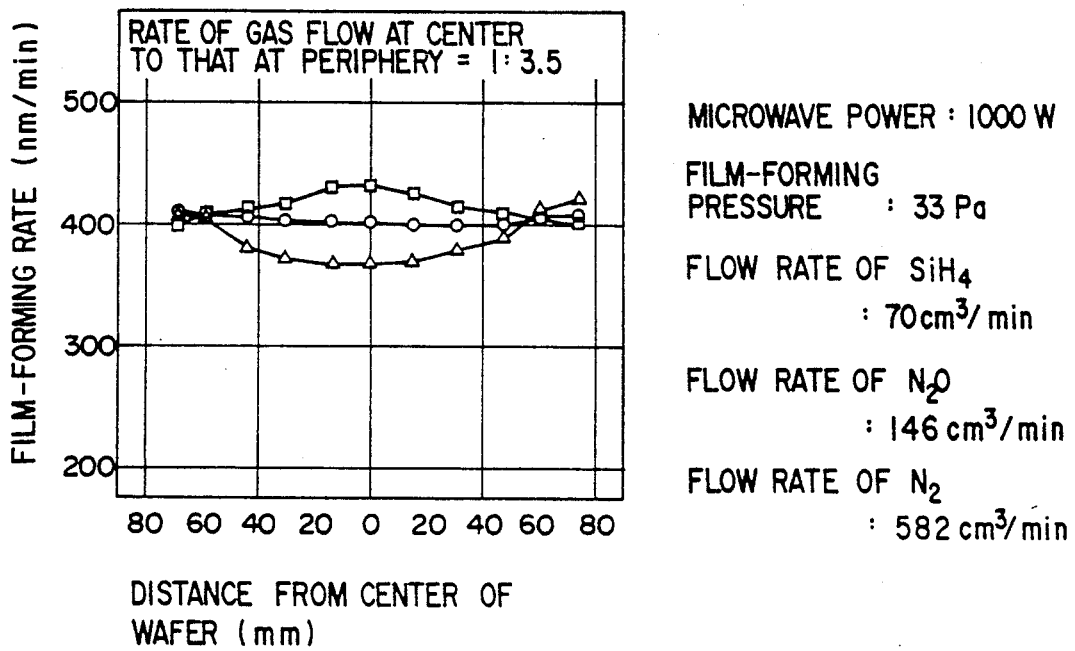
FIG. 10 is a graph view showing the relationship between the distance from the center of a wafer and the film-forming rate in the embodiment shown in FIG. 9.

A further embodiment of the present invention is shown in FIG. 9. The apparatus in FIG. 9 is formed by adding variable flow rate values 15, 15′ to the apparatus in FIG. 8 (which is substantially similar to the apparatus in FIG. 1). In short, a variable flow rate valve 15 is provided in a gas supply system in which gas passes through the axis of the coaxial resonator 1; and another variable flow rate valve 15′ is provided in a gas supply system in which gas is led into the plasma generating chamber 6 through the gas leading inlets 12′′ provided in the peripheral walls. Each of the variable flow rate valves 15, 15′ is constituted by a mass flow controller arranged so as to control a flow rate of the gas. An example of forming a plasma silicon oxidized film while controlling the flow rate of the gas by this arrangement is shown in FIG. 10. FIG. 10 shows the intra-wafer distribution of film-forming rate measured by using the rate of the flow of the gas passing through the axis to the flow of the gas supplied through the peripheral walls as a parameter. When, for example, the ratio of the flow of the gas in the center portion to the flow of the gas in the peripheral portion is 1:3.5, the distribution becomes convex in the graph. When, for example, the ratio of the flow of the gas in the center portion to the flow of the gas in the peripheral portion is 1:5, the distribution becomes concave in the graph. When the ratio is 1:4, the thickness of the thus formed film is uniform with the accuracy of ±3%. Accordingly, the distribution of film thickness can be controlled over a range of from the concave form to the convex form. Consequently, there arises an effect in that uniform film thickness can be obtained.

Figure 11:
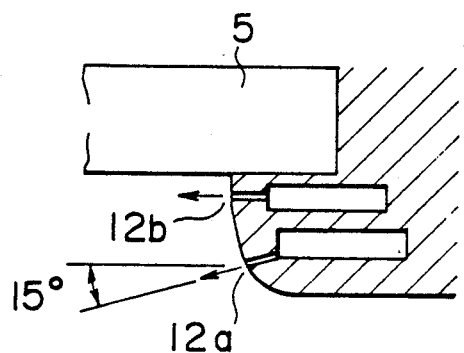
FIG. 11 is an enlarged view of the gas leading inlets formed in the peripheral wall portions depicted in FIG. 8.
Figure 12:
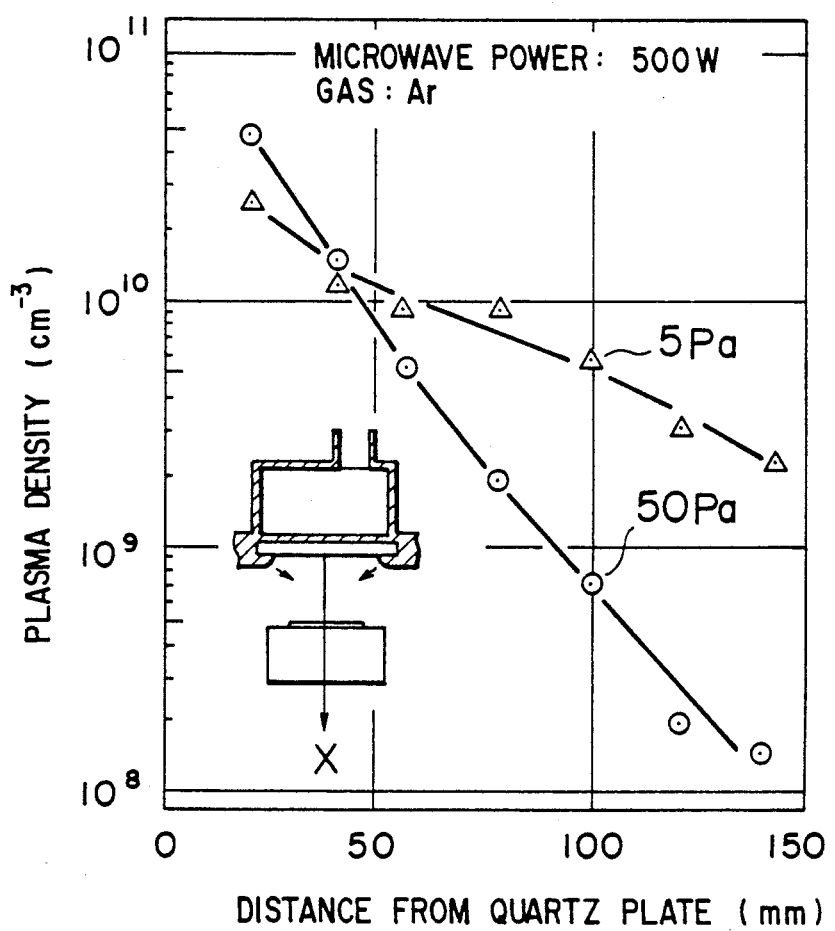
FIG. 12 is a graph view showing the relationship between the distance from a quartz plate and the plasma density.

FIG. 11 is an enlarged view of a peripheral gas leading-in portion provided in this embodiment. Gas leading inlets 12′′a are provided so as to blow out gas at an angle of 15° with respect to the horizon. Gas leading inlets 12′′b are provided horizontally. Film-forming gas such as for example gas including $SiH_4$ and TEOS is led in through the gas leading inlets 12′′a, while inert gas such as $N_2$ gas or $N_2O$ gas is led in through the gas leading inlets 12′′b. As a result, the concentration of the film-forming gas in the vicinity of the surface of the quartz window 5 is reduced to reduce the amount of the gas deposited on the quartz window 5. On the other hand, the density of plasma generated in the plasma generating chamber 6 increases as the distance from the microwave leading inlet decreases, that is to say, as the distance from the slot plate 4 decreases. FIG. 11 shows the result of measurement of the distribution of the plasma density. It is apparent from FIG. 11 that the plasma density increases as the distance from the quartz window decreases. In this embodiment, the gas leading inlets 12a are inclined at an angle of 15° to blow out the film-forming gas lowered high-density plasma generating space. Accordingly, there arises an effect in that the number of free radical species generated in the plasma increases to thereby improve the film-forming rate. Furthermore, there arises an effect in that uniform film is formed on the substrate because the gas is not mixed with the gas passing through low-density plasma areas to the substrate.

As described above, according to the present invention, the cavity resonator is of a coaxial resonator type in which CVD gas leading inlets are formed in the inside of the axis and in the peripheral portion of the cavity resonator so as to blow out gas toward the center and peripheral portions of the substrate. Accordingly, the flow of gas passing through the surface of the substrate can be made uniform so that uniform film can be formed.

The cavity resonator has slots in a plane opposite to the substrate, the slots serving to radiate microwave energy into the plasma generating chamber. The resonance mode of the cavity resonator is made to be an H mode. The slots are shaped like arcs annularly arranged so as to be symmetrical with each other with respect to the axis. Accordingly, uniform plasma symmetrical with respect to the axis can be generated to thereby form uniform thin film.

Further, the cavity resonator is constituted by a plurality of different-size resonator units or chambers arranged so as to be symmetrical with each other with respect to the axis. Accordingly, uniform thin film can be formed even in the case where the substrate is large-scaled.

Further, the variable flow rate valves are respectively provided to control the flow rate of the gas supplied into the plasma generating chamber through the gas flow paths formed in the inside of the axis of the coaxial resonator and the flow rate of the gas supplied through the peripheral walls of the resonator. Accordingly, the distribution of film thickness can be controlled over a range of from a concave form to a convex form. Consequently, uniform thin film can be formed.

Further, the gas leading inlets for leading gas into the plasma generating chamber are provided to blow out gas toward a space in which high-density plasma is generated. Accordingly, the number of free radical species generated in the plasma is increased. Accordingly, not only the film-forming rate can be improved but free radical species on the wafer can be made uniform in number. Consequently, uniform thin film can be formed.

Figure 13:
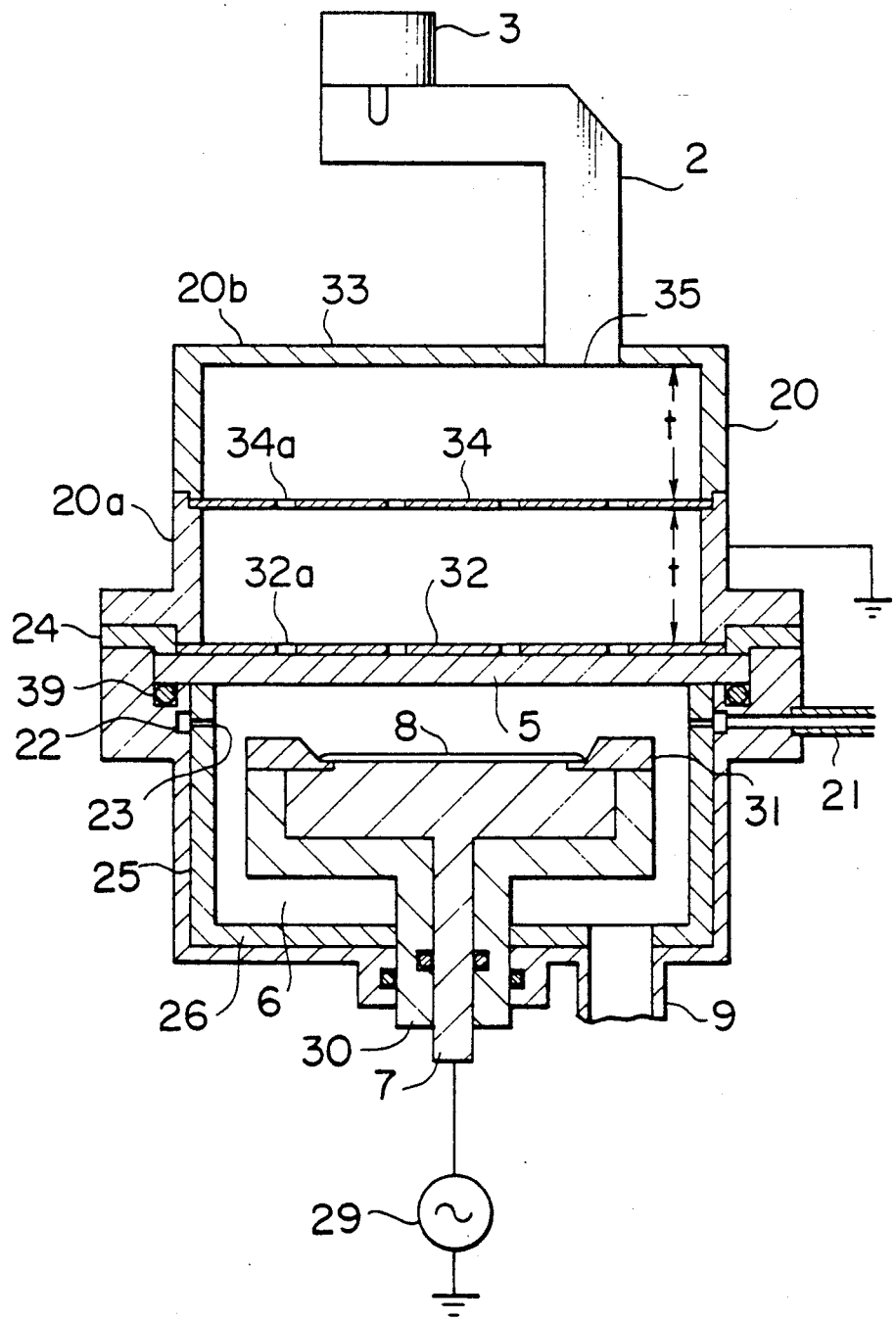
FIG. 13 is a constituent view of a plasma processing apparatus as a seventh embodiment of the present invention.

FIG. 13 is a sectional view of a plasma processing apparatus as a further embodiment of the present invention. A thick quartz cylinder 25 and a quartz ring 26 are provided in the inside of a bottomed cylinder-shaped plasma chamber 6. The plasma chamber is covered, through an 0-ring 39, with a thick quartz plate 5 provided in the upper opening portion thereof. The quartz plate 5 serves to seal the plasma chamber 6 through a pressing ring 24. A ring-like gas guide groove 22 is formed in the peripheral wall of the plasma chamber 6. A plurality of gas leading inlets 23 communicated with the gas guide groove 22 are formed at equal circumferential intervals in the outer circumference of the quartz cylinder 26, so that the gas led into the gas guide groove 23 through the gas supply pipe 21 from a gas source not shown in blown out uniformly into the plasma chamber 6.

An electrode 7 insulated by an insulator 30 is airtightly inserted and fixed in the plasma chamber 6 at the bottom thereof so that the substrate 8 can be mounted on the electrode 7. A microwave electric source 29 is connected to the electrode 7. The electrode 7 is covered with a quartz ring 31 so that the outer portion of the electrode 7 is sealed by the quartz ring 31. Further, a gas exhaust pipe 9 connected to a vacuum pump (not shown) is communicated with the plasma chamber 6.

An opening portion of a cavity resonator chamber 20a forming a cylindrical cavity resonator is blocked by a slot plate 32 so that the cavity resonator chamber 20a is fixed onto the plasma chamber 6 through the slot plate 32 provided so as to be in close contact with the quartz plate 5. The slot plate 32 is arranged, through the quartz plate 5, so as to be opposite to the substrate 8 mounted on the electrode 7. The cavity resonator chamber 20a and the slot plate 32 are grounded electrically. The cavity resonator chambers 20a and 20b in this embodiment constitute an $E_{01}$ mode circular cavity resonator.

An opening portion of the bottomed cylinder-shaped cavity resonator chamber 20b is blocked by the slot plate 34 which is connected and fixed onto the cavity resonator chamber 20a to block the other opening portion of the cavity resonator chamber 20a. Accordingly, the cavity resonator chamber 20b and the slot plate 34 are grounded electrically. The two slot plates 34 and 32 are arranged in parallel with each other. A waveguide 2 is connected to the bottom of the cavity resonator chamber 20b so as to be located in an eccentric position with respect to the cavity resonator chamber 20b. A magnetron 3 as a microwave generator is provided in an end portion of the waveguide 2. The purpose of the eccentric position of the waveguide 2 on the cavity resonator chamber 20b is to improve the degree of coupling in the $E_{01}$ mode. The length t of each of the cavity resonator chambers 20a and 20b is established to be an integral multiple of the half of the guide wavelength or a value near the integral multiple thereof.

Figure 14:
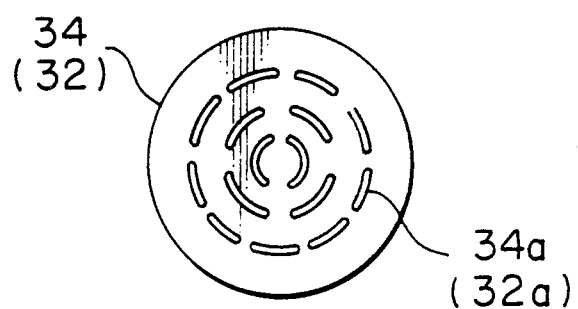
FIGS. 14 through 16 are plan views respectively showing examples of the construction of slot plates depicted in FIG. 13.

FIG. 14 is a plan view of the slot plate 34. The slot plate 34 has slots 34a annularly formed Perpendicularly to the electric field in the $E_{01}$ mode. To improve the degree of radiation of the microwave through the slots 34a, the length of each of the slots 34a is established to be not less than 60 nm which is equal to the half wave length of the microwave, in the case where the wave length of the microwave used is 2.45 GHz.

In the case where the aforementioned plasma processing apparatus is used, the apparatus can be operated as follows. First, the inside of the plasma chamber 6 is kept at a high vacuum by operating the vacuum pump not shown. Then, both a flow rate of the gas supplied from the gas source not shown and an exhaust rate of the gas in the vacuum pump are adjusted to make the gas pressure in the plasma chamber 6 to be a value within a predetermined range of 1 to $10^{-3}$ Torr. A microwave is generated by operating the magnetron 3. The microwave is led into the cavity resonator chamber 20b through the waveguide 2. The microwave led into the cavity resonator 20b is amplified in the cavity resonator chamber 20b. The amplified microwave is radiated into the cavity resonator chamber 20a through the slots 34a of the slot plate 34.

Because the energy of the microwave radiated through the slots 34a changes according to the distribution of the electric field intensity formed by the standing wave in the cavity resonator, the standing wave must be uniform in the cavity resonator. However, the standing wave formed in the upper cavity resonator chamber 20b hardly has a uniform distribution, because of existence of an opening of coupling with the waveguide 2. Therefore, the lower cavity resonator chamber 20a and the lower slot plate 32 are provided to make the distribution of the standing wave in the lower cavity resonator chamber 20a relatively uniform compared with that in the upper cavity resonator chamber 20b. As a result, the distribution in energy of the microwave radiated into the plasma generating chamber 6 through the slots 32a is made to be more uniform.

Because the microwave generated in the magnetron 3 is amplified through the cavity resonator 20 constituted by the two cavity resonator chambers 20a and 20b, the gas in the plasma chamber 6 is so excited to form ion gas or free radical gas that plasma is ignited and maintained by supply of the microwave energy even though the plasma chamber 6 has not a structure of a cavity resonator.

As for the plasma generated by the microwave, the microwave acts directly on electrons in the plasma so that the voltage difference between the plasma and the substrate takes a level within a range of from 20 to 30 volts. Accordingly, the energy of ions entering the substrate 8 only owing to the plasma generated by the microwave is so weak that anisotropic etching is difficult. Therefore, ions in the plasma are accelerated by applying a high-frequency voltage generated by a high-frequency electric source 29 to the electrode 7 before the ions enter the substrate 8. In this condition, the energy of the ions can be controlled suitably by the applied voltage so as to take a proper value. Accordingly, anisotropy can be made high to attain high-accurate etching.

The high-frequency electric power applied to the electrode 7 flows in the plasma toward the ground. If the high-frequency current is not uniform, the energy of ions entering the substrate 8 cannot be made uniform on the substrate 8, and, accordingly, there arises a disadvantage in that etching speed changes variously on the substrate. In this embodiment, the slot plate 32 is arranged so as to be opposite to the electrode 7 so that the high-frequency current flows uniformly on the electrode 7.

In the conventional apparatus, the etching characteristics of poly-Si film under the condition that no side-etching occurs are as follows: etching speed is 100 nm/min; uniformity is within a range of $\pm 10\%$ and the rate of the etching speed in poly-Si film to the etching speed in the fundamental $SiO_2$ film is within a range of 6 to 7. If the etching speed in the conventional apparatus is increased to be not less than 300 nm/min, the energy of incident ions becomes so excessive that the rate of the etching speed in poly-Si film to the etching speed in the fundamental $SiO_2$ film is lowered to be not more than 5. Furthermore, damage of elements occurs so easily that the aforementioned improvement cannot be put into practice.

In this embodiment, however, it is possible to obtain the etching speed of not less than 1000 nm/min, the rate of the etching speed in the poly-Si film to that in the fundamental $SiO_2$ film of not less than 10, and uniformity within a range of $\leq 5\%$.

In this embodiment, accordingly, the yield and reliability of plasma-processed final products can be improved. Although etching as an example of plasma processing has been described, it is a matter of course that the same effect can be obtained on other plasma processing.

Figure 15:
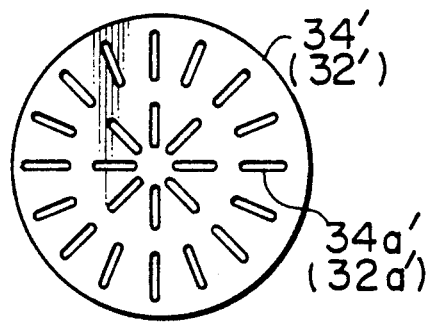
Figure 16:
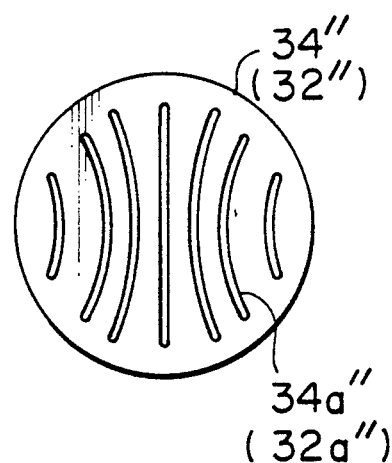

FIGS. 15 and 16 show other examples 34a' and 34a" of the construction of the slots 34a in the slot plate 34. The slot plate 32 (32', 32") may have the same structure as that of the slot plate 34 (34', 34") or may have a structure different from that of the latter. For example, slot plates 32 and 34 the same structure as shown in FIG. 14 may be used in this invention. Alternatively, a slot plate 34' having such a structure as shown in FIG. 15 and a slot plate 32" having such a structure as shown in FIG. 16 may be used in combination.

Although the aforementioned embodiment has shown the case where the plasma processing apparatus has two stages each constituted by a combination of a cavity resonator and a slot plate, it is a matter of course that the number of stages may be established to be three or more and that uniformity i the distribution of the energy of the microwave supplied into the plasma chamber 6 can be improved more as the number of stages is increased.

Further, as to the structure of the resonator and the frequency of the high-frequency electric source, the present invention is not limited to this embodiment. The structure of the resonator, such as a rectangular structure, a coaxial structure, or the like, can be selected freely as long as the condition of resonance can be established. The frequency of the high-frequency electric source can be selected freely from a range of from DC to the order of tens of MHz. In the case where the target to be subjected to plasma processing is insulating film or includes insulating film, the preferred high frequency is selected from a range of from 100 KHz to the order of tens of MHz. In the conventional ECR method, the microwave from the opening portion of the waveguide is radiated directly into the plasma generating chamber. If a ground electrode is disposed between the plasma generating chamber and the opening portion of the waveguide, the microwave cannot be supplied into the plasma generating chamber because the microwave is reflected by the ground electrode.

In the aforementioned embodiment, the end surface of the waveguide or in other words the end surface of the cavity resonator is closed. The slots through which the microwave is radiated are provided in the end surface. The end surface of the waveguide is arranged to be electrically grounded as occasion demands.

The total opening area of the slots 32a and 34a can be established so as to be about one-third as much as the whole area of the end surface of the waveguide (cavity resonator chambers 20a and 20b). Accordingly, in the case where a high-frequency voltage is applied to the electrode 7 mounting the substrate 8, a high-frequency current is passed uniformly between the end surface (slot plate 32) of the waveguide (cavity resonator 20b) and the electrode 7 so that the effect of ions can be given to the whole surface of the substrate 8 uniformly. Further, a sufficient quantity of microwave can be supplied through the slots 32a, so that high-density plasma can be generated.

In this embodiment in which the cavity resonator is connected to the waveguide 2, the microwave amplified by resonation in the cavity resonator chambers 20a and 20b is radiated into the plasma generating chamber 6 through the slots 34a and 32a. Accordingly, high-density plasma can be generated even though the plasma generating chamber 6 has not a structure of a cavity resonator used in the prior art.

Accordingly, the structure of the electrode in this embodiment is not restricted by the structure of the cavity resonator, though the structure of the electrode in the prior art is restricted by the structure of the electrode. Further, the state of resonance in the cavity resonator does not change because there is no generation of plasma in the cavity resonator. Accordingly, plasma can be generated stably. Further, because the cavity resonator can be grounded electrically, the cavity resonator can be used as a counter electrode arranged in parallel to the electrode in the same manner as in the ECR method. Accordingly, the effect of ions can be given to the whole surface of the substrate uniformly.

Figure 17:
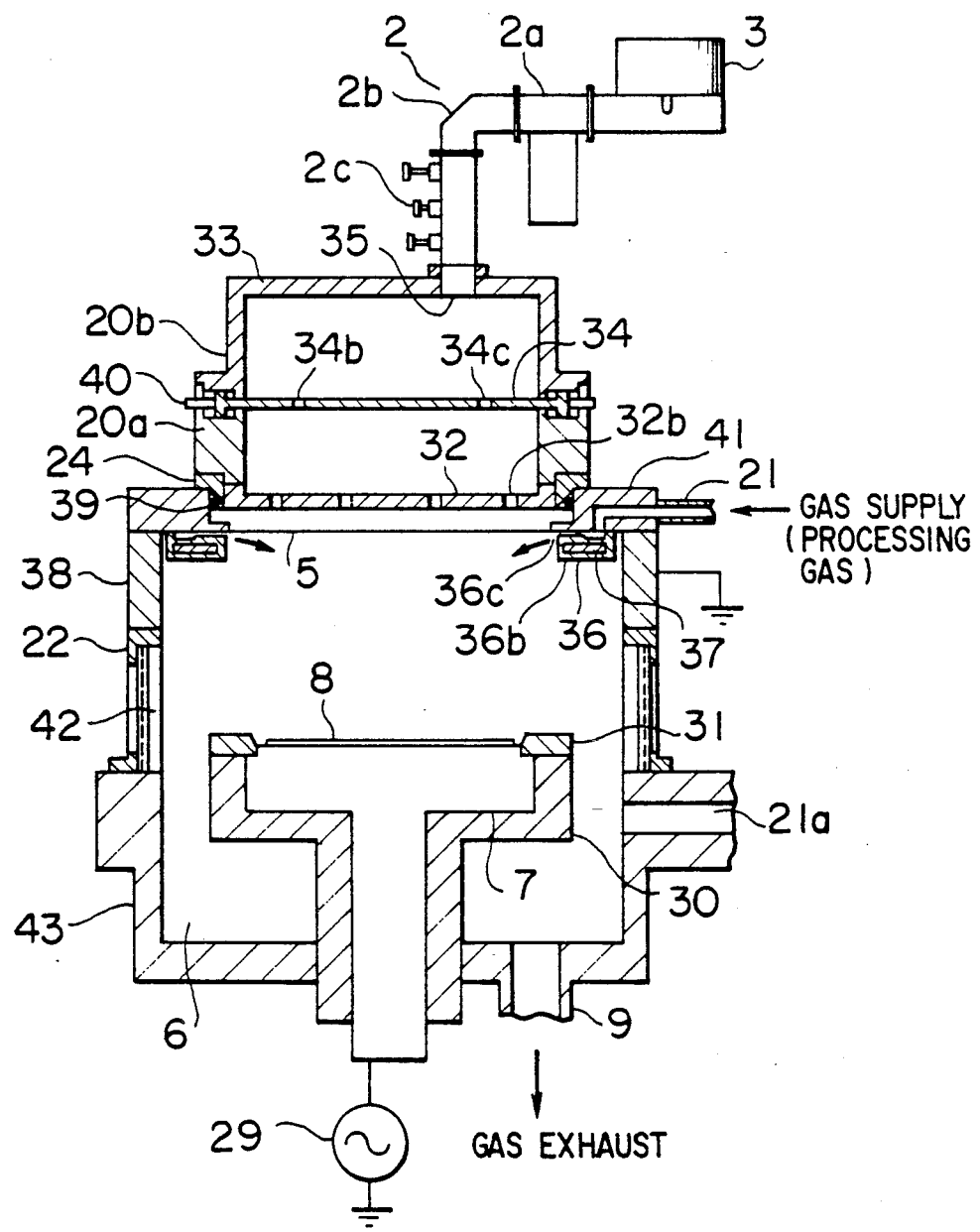
FIG. 17 is a vertical sectional view of a plasma processing apparatus as an eighth embodiment of the present invention.

A further embodiment will be described hereunder with reference to FIGS. 17 through 30. In short, FIG. 17 is a sectional view of a plasma processing apparatus as a further embodiment of the present invention. A quartz casing 42, a casing stopper 22 for fixing the quartz casing and a height adjusting casing 38 are put on a bottomed cylinder-shaped lower casing 43. An upper opening portion is covered with a thick quartz plate 5 attached to a casing flange 41. The respective contact surfaces of the casings and the like are sealed by O-rings or the like so that the inside of the plasma chamber 6 is kept airtight. For example, an O-ring 39 is fixed to the circumference of the quartz plate 5 by an O-ring stopper 24. A gas leading pipe 21 is provided in the casing flange 41 provided in the upper portion of the plasma chamber 6. Grooves 36b and gas nozzles 36c are provided in a gas nozzle ring 36 communicated with the gas leading-in pipe 21, so that processed gas can be blown out into the plasma chamber uniformly. To improve the ignition property of plasma, permanent magnets 37 are arranged at intervals of a circumferentially equal pitch in the inside of the gas nozzle ring 36. In other words, magnet means 37 for improving the ignition property of plasma are provided in the inside of the gas nozzle ring 36 leading processed gas.

A stage electrode 7 electrically insulated by an insulator 30 is inserted into the lower casing 43 from the under surface thereof so as to be airtight and vertically movable. The substrate 8 is mounted on the stage electrode 7. A high-frequency electric source 29 is connected to the stage electrode. A quartz ring 31 is provided round the stage electrode 31. A gas exhaust pipe 9 connected to a vacuum pump not shown is communicated with the plasma chamber 6.

Figure 30:
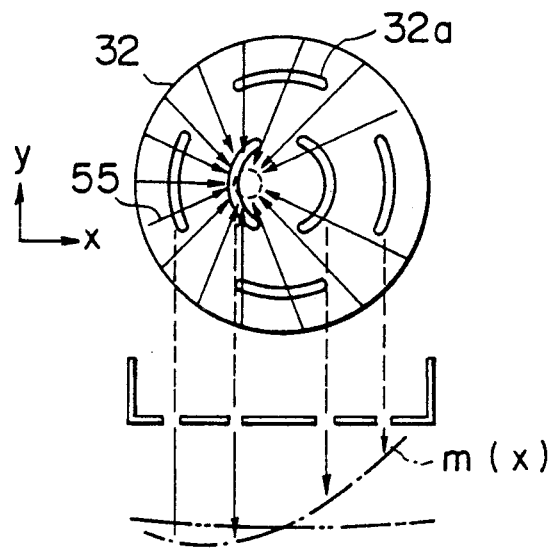

One opening portion of a cylindrical cavity resonator chamber 20a is blocked by a slot plate 32 having slots 32a which, for example, are formed as shown in FIG. 30. The cavity resonator chamber 20a is fixed to the upper portion of the plasma chamber 6 so that the slot plate 32 of the cavity resonator chamber is in close contact with the quartz plate 5. In this embodiment, the cavity resonator chambers 20a and 20b constitute an $E_{01}$ mode circular cavity resonator.

The opening portion of the bottomed cylinder-shaped cavity resonator chamber 20b is blocked by a slot plate 34 which is connected and fixed onto the cavity resonator chamber 20a so that the slot plate 34 serves to block the other opening portion of the cavity resonator chamber 20a. The slot plate 34 is slightly horizontally movably arranged between the cavity resonator chambers 20a and 20b and positioned by a set-screw 40. The two slot plates 34 and 32 are arranged in parallel to each other. A waveguide 2 is connected to the bottom of the cavity resonator chamber 20b so as to be located in an eccentric position with respect to the cavity resonator chamber 20b. A magnetron 3 as a microwave generator is provided in an end portion of the waveguide 2. The purpose of the eccentric position of the waveguide 2 on the cavity resonator chamber 20b is to improve the degree of coupling in the $E_{01}$ mode. In short, because a surface current in the $E_{01}$ mode is passed radially from the center to the outside, the waveguide 2 must be eccentrically mounted onto the cavity resonator chamber 20b to improve the degree of coupling. The waveguide 2 is constituted by a dummy load 2a, a corner waveguide 2b and a matching unit 2c. The inner length La, Lb of each of the cavity resonator chambers 20a and 20b is established to be an integral multiple of the half of the guide wavelength $\lambda g$ or a value near the integral multiple.

Figure 18:
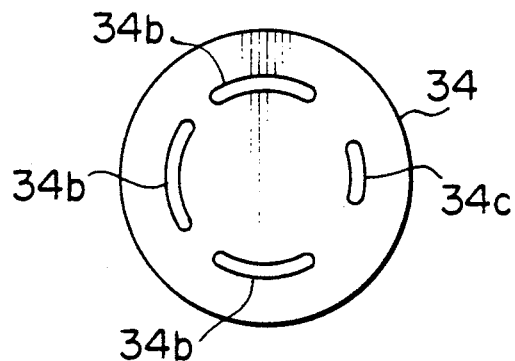
FIG. 18 is a plan view showing an example of the construction of the slot plates depicted in FIG. 17.

FIG. 18 is a plan view of the slot plate 34. The slot plate 34 has slots 34b and 34c annularly formed perpendicularly to the electric field in the $E_{01}$ mode. To improve the degree of radiation of the microwave through the slots 34b, the length of each of the slots 34b except the slot 34c provided just under an opening portion 35 of the waveguide is established to be not less than 60 nm which is equal to the half wave length of the microwave, in the case where the wave length of the microwave used is 2.45 GHz. The length of the slot 34c is determined so as to make the total impedance of the waveguide opening portion 35 and the slot 34c equal to the impedance of each of the slots 34b. In this embodiment, the length of the slot 34c is established to be about 50 nm from the result of experiment.

Figure 28:
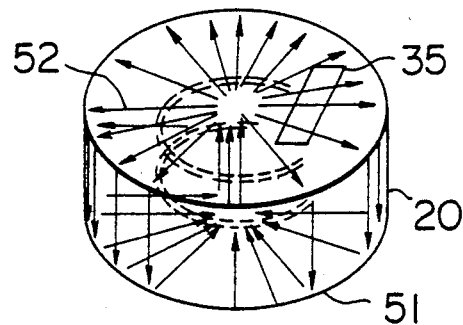
FIG. 28 is a model view showing the relationship between the distribution of an electromagnetic field in the inside of the cavity resonator and the position of a waveguide in the case where the mode of the resonator in the apparatus according to the present invention is made to be an $E_{01}$ mode.
Figure 29:
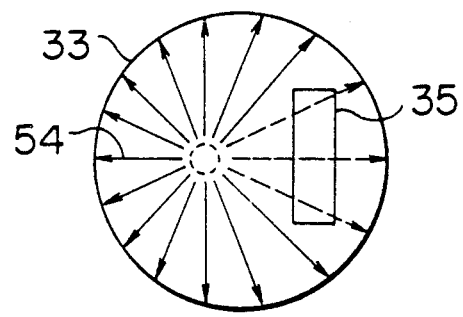
FIGS. 29 and 30 are model views showing eccentricity in the distribution of surface current and microwave radiation intensity in the cavity resonator, the eccentricity being caused by eccentricity of the waveguide in the $E_{01}$ mode.

In the case where the aforementioned plasma processing apparatus is used, the apparatus can be operated in a manner as follows. First, the inside of the plasma chamber 6 is kept at a high vacuum by operating the vacuum pump not shown. Then, both a flow rate of the gas supplied from the gas source not shown and an exhaust rate of the gas in the vacuum pump are adjusted to make the gas pressure in the plasma chamber 6 be a value within a predetermined range of 0.1 to 100 Pa. A microwave is generated by operating the magnetron 3. The microwave is led into the cavity resonator chamber 20b through the waveguide 2. The microwave led into the cavity resonator 20b is amplified in the cavity resonator chamber 20b. The amplified microwave is radiated into the cavity resonator chamber 20a through the slots 34b and 34c of the slot plate 34. The waveguide opening portion 35 is arranged in an eccentric position with respect to the axis of the cylindrical cavity resonator 20 to improve the degree of coupling of the microwave as shown in FIG. 28 which is a view showing a model of electromagnetic field distribution in the cavity resonator. Further, the size of the waveguide opening portion 35 is established to be equal to the inner size of the waveguide because of the necessity of increasing the quantity of microwave electric power to improve the cavity of plasma processing. Accordingly, not only impedance against the surface current crossing the waveguide opening portion becomes large but impedance in the inside of the cavity resonator chamber 20b becomes large in the side of the waveguide opening portion 35. In FIG. 28, the reference numeral 51 designates a magnetic field and 52 an electric field. As a result, the electric field intensity of the microwave radiated through the slots 32a of the slot plate 32 is one-sided to the side reverse to the waveguide opening portion as shown in FIGS. 29 and 30 in which: eccentricity in the distribution of the surface current influenced by the waveguide opening portion is shown in FIG. 29; and the distribution of the surface current and the distribution of the microwave radiation intensity m(x), m(y) in the radiating slot plate are shown in FIG. 30. However, because the cavity resonator 1 in this embodiment is constituted by cavity resonator chambers 20a and 20b provided with a slot plate 32 arranged therebetween and because the length of a slot 32c is established to be less than the length of each of slots 32b to reduce impedance, the radiation impedance of the microwave radiated from the cavity resonator chamber 20b to the cavity resonator chamber 20a is corrected so as to be uniform circumferentially. In FIG. 29, the reference numeral 33 designates a ceiling of the cavity resonator chamber 20b, and 54 designates a current flowing in the surface of the ceiling. In FIG. 30, the reference numeral 32 designates a microwave radiating slot plate, and 55 designates a current flowing in the surface of the slot plate. In FIG. 30, m(x) represents the x-direction distribution of radiation intensity of the microwave radiated from the slot plate 32, and m(y) represents the y-direction distribution of radiation intensity of the microwave radiated from the slot plate 32. Accordingly, the surface current generated by a standing microwave in the cavity resonator chamber 20a is kept almost constant circumferentially. Accordingly, the distribution of the microwave radiated through the slots 32a of the slot plate 32 becomes symmetrical with respect to the axis of the cavity resonator.

Thus, the microwave which has a high electric field intensity and which is balanced is radiated into the plasma chamber 6. In this case, uniformity can be improved from the range between $\pm 30$ and $\pm 80\%$ to the range of $\pm 2\%$ or less. Free electrons in the plasma chamber are accelerated by the electric field of the microwave and collide with molecules of processing gas (for example, an etching gas selected from a mixture gas of BCl$_3$ and Cl$_2$ and a mixture gas of SF$_6$, or a CVD gas formed by combining a gas selected from an SiH$_4$ gas, an N$_2$O gas and an O$_2$ gas with an N$_2$ gas as a diluent). As a result, the gas is excited to form ion gas or free radical gas to thereby generate plasma.

Because the microwave acts directly on electrons in the plasma generated by the microwave, the voltage difference between the plasma and the substrate 8 is within a range of from 20 to 30 volts. Accordingly, the energy of ions entering into the substrate 8, obtained by use of only the plasma generated by the microwave, is so weak that anisotropic etching is difficult. Therefore, ions in the plasma are accelerated by applying a high-frequency voltage generated by a high-frequency electric source 29 to the electrode 7 before the ions enter into the substrate 8. In this condition, the energy of the ions can be controlled suitably by the applied voltage so as to have a proper value. Accordingly, anisotropy can be improved to attain high-accurate etching. The high-frequency electric power applied to the electrode 7 flows in the plasma toward the surface of the casing 6 and the gas nozzle ring 36 which are electrically grounded. Because the gas nozzle ring 36 and the casing 6 are arranged substantially opposite to the substrate 8, the distribution of the high-frequency voltage applied to the substrate 8 becomes uniform in the substrate 8. Accordingly, uniform etching or uniform film formation can be achieved.

In the dry etching apparatus in this embodiment, high-performance etching or film formation excellent in uniformity can be carried out in the conditions as follows: poly-Si etching speed is not less than 600 nm/min; the rate of the etching speed of poly-Si film to the etching speed of the foundation SiO$_2$ film is not less than 15; uniformity is within a range of ±105; and the quantity of side etching is not more than 0.02 μm.

Accordingly, in this embodiment, the yield and reliability of plasma-processed final products can be improved greatly. Although etching as an example of plasma processing has been described, it is a matter of course that the same effect can be obtained on other plasma processing such as for example plasma CVD as long as a suitable processing gas is selected.

Figure 19:
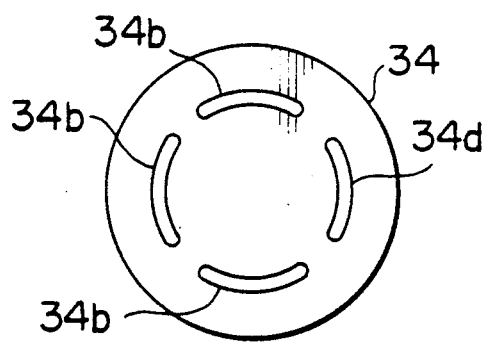
FIGS. 19 through 22 are plan views respectively showing examples of the construction of the slot plates different from the example shown in FIG. 18.
Figure 20:
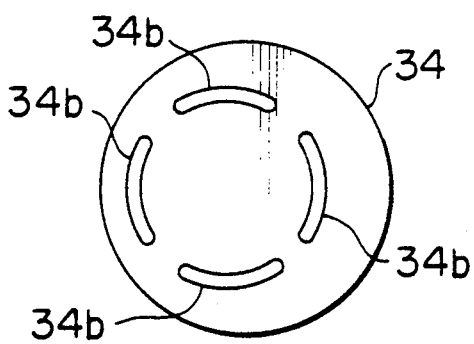
Figure 21:
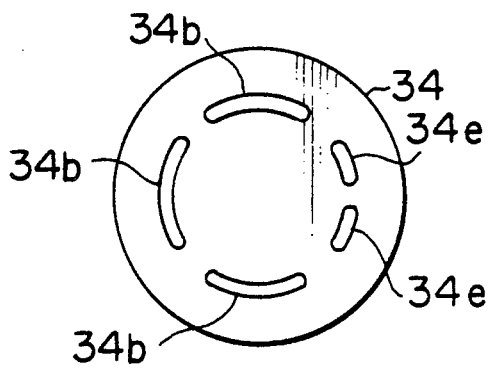
Figure 22:
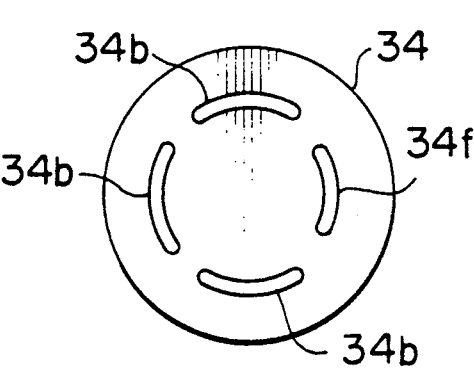

FIGS. 19 through 22 show other examples of the slot plate 34 in the E$_{01}$ mode for the purpose of correcting the distribution of the surface current. As shown in FIG. 19, the width of a slot 34d may be established to be less than that of each of the other slots for the purpose of reducing the area of the slot 24d. As shown in FIG. 20, slots 34b may be arranged eccentrically in a direction reverse to the direction of eccentricity of the waveguide opening portion 35. As shown in FIG. 21, the slot just under the waveguide opening portion may be separated into a plurality of slot portions 34e for the purpose of reducing the area of the slot. As shown in FIG. 22, only the position of a slot 34f may be shifted toward the center. These examples may be used respectively singly or in combination. There arises an effect in that the microwave radiation intensity distribution m(x) can be suitably corrected by a simple method of exchanging the slot plate 34 even though the condition in use changes.

Figure 23:
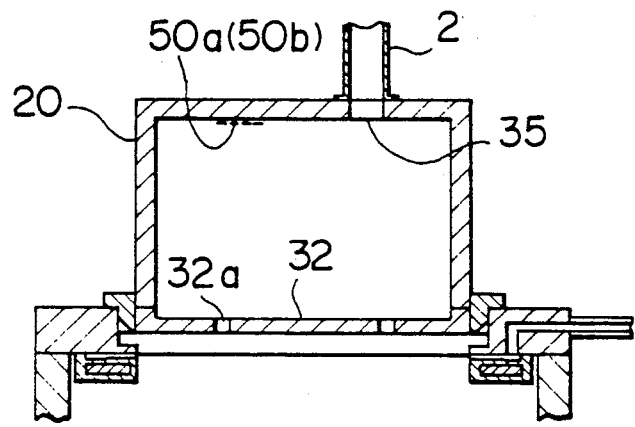
FIG. 23 is a vertical sectional view of a plasma processing apparatus as a ninth embodiment of the present invention.
Figure 24:
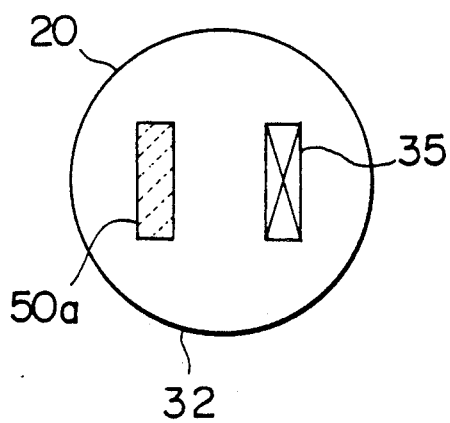
FIGS. 24 and 25 are plan views respectively showing examples of construction of slot plates depicted in FIG. 23.
Figure 25:
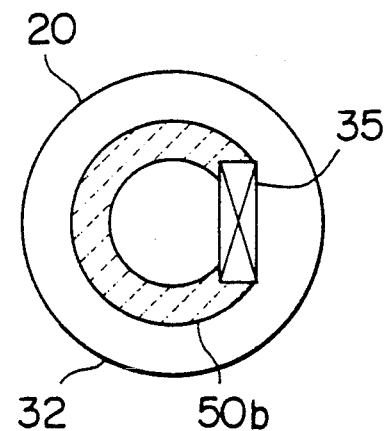
Figure 26:
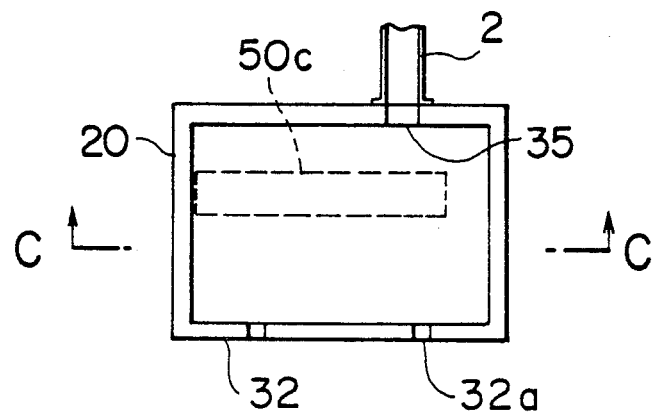
FIG. 26 is a vertical sectional view of a cavity resonator portion of a plasma processing apparatus as a tenth embodiment of the present invention.
Figure 27:
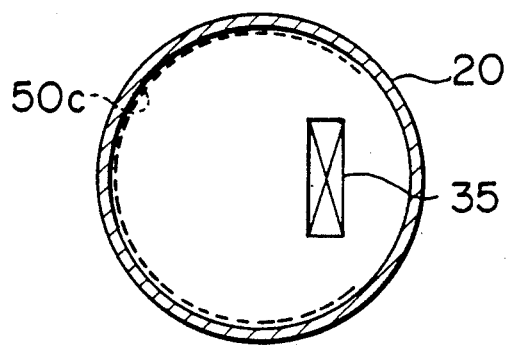
FIG. 27 is a sectional view taken along the line C—C in FIG. 26.

FIG. 23 shows an embodiment in which a resistor 50a (50b) is partially formed on the upper surface of the cavity resonator 20 by means of evaporating deposition, sputtering or the like to make the impedance thereof and the impedance of the waveguide opening portion 35 in the microwave symmetrical with each other with respect to the axis. The resistor may be shaped like a rectangle as shown by the reference numeral 50a in FIG. 24 or may be shaped like a ring as shown by the reference numeral 50b in FIG. 25. Further, the resistor may be provided in the side surface of the cavity resonator 20 as shown by the reference numeral 50c in FIGS. 26 and 27. FIG. 27 is a sectional view taken along the line C—C in FIG. 26.

Figure 31:
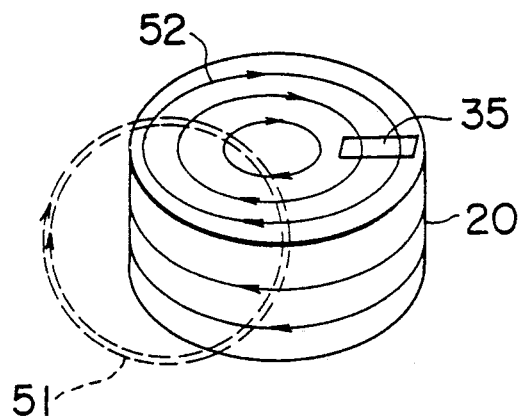
FIG. 31 is a model view showing the relationship between the distribution of an electromagnetic field in the inside of the cavity resonator and the position of a waveguide in the case where the mode of the resonator in the apparatus according to the present invention is made to be an $H_{01}$ mode.
Figure 32:
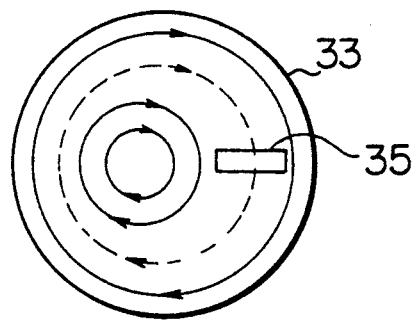
FIG. 32 is a view showing the influence of the eccentricity of the waveguide in the $H_{01}$ mode.

Although the aforementioned embodiments have shown the case where the mode of the cavity resonator is an E$_{01}$ mode, it is a matter of course that the same though as described above can be applied to the case where the mode of the cavity resonator is an H$_{01}$ mode. FIG. 31 shows a model of a electromagnetic field distribution in the cavity resonator in the H$_{01}$ mode. Also in the H$_{01}$ mode, the waveguide 35 must be provided eccentrically to attain adjustment with respect to the direction of the electric field 51. As a result, the surface current in the ceiling 33 of the cavity resonator is one-sided by the influence of the waveguide opening portion 35, so that ununiformity occurs in the x-direction distribution of microwave radiation intensity. Accordingly, any one of the measures described above is required.

As described above, according to the present invention, there arises an effect in that generation of plasma by use of microwave is stabilized.

Further, according to the present invention, there arises an effect in that the apparatus is not restricted by the structure of the cavity resonator. Accordingly, the cavity resonator can be grounded electrically to be used as a counter electrode arranged in parallel with the electrode mounting a subject. As a result, the energy of the microwave can be propagated through slots provided in the counter electrode, so that the effect of ions or free radicals generated by this energy can be given to the subject uniformly.

Further, the effect of ions or free radicals can be generated uniformly. As a result, speedy and optimum plasma processing can be carried out based on the ion energy. Further, fine patterns in semiconductor wafer can be formed with high accuracy, at a high speed and with little damage. Further, there arises an effect in that uniform film can be formed at a high speed.

Further, two or more stages each constituted by a combination of a cavity resonator and a slot plate can be used in the present invention by which uniformity in the distribution of energy of the microwave radiated through the slots can be improved. Accordingly, there arises an effect in that uniformity in plasma processing can be more improved.

Further, according to the present invention, in the case where plasma is generated by radiating a microwave having high electric field intensity into the plasma chamber by using a cavity resonator and a slot antenna in combination, the distribution of the microwave radiated into the plasma generating chamber can be corrected easily by a simple method. Accordingly, very good uniformity in plasma processing can be obtained. There arises an effect in that the yield and reliability of plasma-processed final products can be improved.

We claim:
1. A plasma processing apparatus comprising:
 a microwave generating source;
 a coaxial cavity resonator for making a microwave supplied from said microwave generating source resonate, said coaxial cavity resonator having an axial portion in the center of cylindrical shape;

an axial gas flow path formed in an axial portion of said cavity resonator for making a CVD gas flow therethrough so as to prevent said microwave generated by the coaxial cavity resonator from entering thereinto, said axial gas flow path being connected to a gas source;

a peripheral gas flow formed in peripheral wall portion of said cavity resonator for making a CVD gas flow therethrough so as to prevent said microwave generated by the coaxial cavity resonator from entering thereinto, said peripheral flow path being connected to said gas source;

an axial gas leading inlet provided in under portion of said axial portion for leading-in the CVD gas supplied from said axial gas flow path;

a peripheral gas leading inlet provided in said peripheral wall portion of said cavity resonator for leading-in the CVD gas supplied from said peripheral gas flow path; and, a plasma generating chamber in which the CVD gas led into said plasma generating chamber through said axial gas leading inlet and said peripheral gas leading inlet made to flow uniformly onto a surface of a substrate is subject to the microwave made intensity through resonance in said cavity resonator and radiated through a coupling plate so that uniform plasma is generated to thereby form a thin film on the surface of said substrate.

2. A plasma processing apparatus according to claim 1, in which slots for radiating the resonated microwave into said plasma generating chamber are formed in a surface of said cavity resonator facing said substrate.

3. A plasma processing apparatus according to claim 2, in which said slots are formed arcuately and symmetrically with each other with respect to said axis.

4. A plasma processing apparatus according to claim 2, in which a resonance mode of said cavity resonator is made to be an H mode.

5. A plasma processing apparatus according to claim 1, in which said cavity resonator is constituted by a plurality of cavity resonator units arranged so as to be symmetrical with each other with respect to said axis.

6. A plasma processing apparatus according to claim 1, further comprising control means for relatively controlling a flow rate of the gas led into said plasma generating chamber through said gas leading inlets formed in the under portions of said axis of said cavity resonator and a flow rate of the gas led into said plasma generating chamber through said gas leading inlets formed in the peripheral wall portions of said cavity resonator.

7. A plasma processing apparatus according to claim 1, further comprising control means for separately individually controlling a flow rate of the gas led into said plasma generating chamber through said gas leading inlets formed in the under portions of said axis of said cavity resonator and a flow rate of the gas led into said plasma generating chamber through said gas leading inlets formed in the peripheral wall portions of said cavity resonator.

8. A plasma processing apparatus according to claim 1, in which said gas leading inlets are formed so as to direct to a plasma generating space above said substrate.

9. A plasma processing apparatus comprising:
a microwave generating portion;
a coaxial cavity resonator for making a microwave supplied from said microwave generating portion resonate;
a plurality of gas flow paths formed in an axis of said cavity resonator and in peripheral wall portions of said cavity resonator for making a CVD gas flow therethrough;
a plurality of gas leading inlets for leading-in the CVD gas supplied from said gas flow paths; and
a plasma generating chamber in which the CVD gas led into said plasma generating chamber through said gas leading inlets and made to flow uniformly onto a surface of a substrate is subject to the microwave made intensity through resonance in said cavity resonator and radiated through a coupling plate so that uniform plasma is generated to thereby form a thin film on the surface of said substrate.

10. A plasma processing apparatus according to claim 9, in which slots for radiating the resonated microwave into said plasma generating chamber are formed in a surface of said cavity resonator facing said substrate.

11. A plasma processing apparatus according to claim 10, in which said slots are formed arcuately and symmetrically with each other with respect to said axis.

12. A plasma processing apparatus according to claim 10, in which a resonance mode of said cavity resonator is made to be an H mode.

13. A plasma processing apparatus according to claim 9, in which said cavity resonator is constituted by a plurality of cavity resonator units arranged so as to be symmetrical with each other with respect to said axis.

14. A plasma processing apparatus according to claim 9, further comprising control means for relatively controlling a flow rate of the gas led into said plasma generating chamber through said gas leading inlets formed in said axis of said cavity resonator and a flow rate of the gas led into said plasma generating chamber through said gas leading inlets formed in the peripheral wall portions of said cavity resonator.

15. A plasma processing apparatus according to claim 9, further comprising control means for separately individually controlling a flow rate of the gas led into said plasma generating chamber through said gas leading inlets formed in said axis of said cavity resonator and a flow rate of the gas led into said plasma generating chamber through said gas leading inlets formed in the peripheral wall portions of said cavity personator.

16. A plasma processing apparatus according to claim 9, in which said gas leading inlets are formed so as to direct to a plasma generating space above said substrate.

17. A plasma processing apparatus according to claim 9, in which the gas blowing-out angle of each of said gas leading inlets formed in the peripheral wall portions of said cavity resonator is selected so as to be not larger than 15 degrees relative to the surface of said substrate.

18. A plasma processing apparatus according to claim 9, in which slots are further provided between a microwave leading inlet of said cavity resonator and said first-mentioned slots so as to reduce a one-sided condition of the microwave.

19. A plasma processing apparatus comprising:
a plasma chamber for maintaining plasma generated in the inside of said plasma chamber so as to perform plasma processing;
a first microwave accumulating and intensifying cavity resonance chamber connected with said plasma chamber through a first slot plate;

a second microwave accumulating and intensifying cavity resonance chamber connected with said first cavity resonance chamber through a second slot plate parallel to said first slot plate; and a microwave generator for leading a microwave into said second cavity resonance chamber through a waveguide.

20. A plasma processing apparatus according to claim 19 in which an interval between said respective slot plates is selected to be an integer times as large as a half of the microwave wavelength.

21. A plasma processing apparatus according to claim 1, in which the gas blowing-out of said gas leading inlet formed in the peripheral wall portion of the said cavity resonator inclines against the surface of the substrate and the gas flowing-out of said gas leading inlet formed in under portion of said axial portion of the said cavity resonator point toward the surface of the substrate.

* * * * *